(12) United States Patent
Uenishi et al.

(10) Patent No.: US 6,218,217 B1
(45) Date of Patent: Apr. 17, 2001

(54) SEMICONDUCTOR DEVICE HAVING HIGH BREAKDOWN VOLTAGE AND METHOD OF MANUFACTURING THE SAME

(75) Inventors: Akio Uenishi; Katsumi Nakamura, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/618,761

(22) Filed: Jul. 18, 2000

Related U.S. Application Data

(62) Division of application No. 09/178,767, filed on Oct. 26, 1998, now Pat. No. 6,111,290, which is a continuation of application No. 08/762,175, filed on Dec. 9, 1996, now Pat. No. 5,894,149.

(30) Foreign Application Priority Data

Apr. 11, 1996 (JP) .................................. 8-089439

(51) Int. Cl.$^7$ .............................. H01L 29/74; H01L 29/78
(52) U.S. Cl. ..................... 438/138; 438/133; 438/135; 438/309; 438/270; 438/259; 438/212; 257/331; 257/129; 257/139; 257/341; 257/409; 257/144
(58) Field of Search ........................... 438/134, 270, 438/271, 588, 587, 212, 259, 589, 133, 135, 138; 257/334, 141, 332, 139, 138, 341, 329, 331, 152, 330

(56) References Cited

U.S. PATENT DOCUMENTS

| | | | |
|---|---|---|---|
| 4,571,512 | 2/1986 | Schutten | 327/389 |
| 5,241,194 | 8/1993 | Baliga | 257/133 |
| 5,387,528 | * 2/1995 | Hutchings et al. | 438/270 |
| 5,623,152 | 4/1997 | Majumdar | 257/330 |
| 5,703,384 | 12/1997 | Brunner | 257/139 |
| 5,751,023 | * 5/1998 | Aono | 257/138 |
| 5,864,159 | 1/1999 | Takahashi | 257/330 |
| 5,895,951 | 4/1999 | So et al. | 257/330 |

FOREIGN PATENT DOCUMENTS 7-50405  2/1995 (JP) .

OTHER PUBLICATIONS

Ken'ichi Matsushita et al., "Blocking Voltage Design Consideration for Deep Trench MOS Gate High Power Devices", Proceeding of 1995 International Symposium on Power Semiconductor Devices & ICs, Yokohama, pp. 256–260.

Mitsuhiko Kitagawa et al., "4500 V IEGTs having Switching Characteristics Superior to GTO", Proceeding of 1995 International Symposium on Power Semiconductor Devices & ICs, Yokohama, pp. 486–491.

\* cited by examiner

*Primary Examiner*—Eddie C. Lee
*Assistant Examiner*—Paul E Brock, II
(74) *Attorney, Agent, or Firm*—McDermott, Will & Emery

(57) ABSTRACT

In a semiconductor device with a high breakdown voltage, insulating layers are buried at regions in n$^-$ silicon substrate located between gate trenches which are arranged with a predetermined pitch. This structure increases a carrier density at a portion near an emitter, and improves characteristic of an IGBT of a gate trench type having a high breakdown voltage.

11 Claims, 29 Drawing Sheets

SEMICONDUCTOR DEVICE HAVING HIGH BREAKDOWN VOLTAGE AND METHOD OF MANUFACTURING THE SAME

This application is a divisional of application Ser. No. 09/178,767 filed Oct. 26, 1998, is now U.S. Pat. No. 6,111,290, which is a continuation of application Ser. No. 08/762,175, filed Dec. 9, 1996 is now U.S. Pat. No. 5,894, 149.

BACKGROUND OF THE INVENTION

1. Field of the Invention

The present invention relates to a semiconductor device having a high breakdown voltage and a method of manufacturing the same. More particularly, the present invention relates to a semiconductor device having a high breakdown voltage for use in a high-voltage inverter or the like, and a method of manufacturing the same.

2. Description of the Background Art

Semiconductor devices having a high breakdown voltage for use in high-voltage inverters or the like have recently been demanded to have a higher operation speed and a lower on-voltage in order to improve an operation efficiency and an operation controllability of the high-voltage inverters. In a field of a class of thousands of volts, GTO (Gate Turn-Off) thyristors have been largely used. However, it has been recently studied to improve breakdown voltages of IGBTs (Insulated Gate Bipolar Transistors) which allow increase in speed of devices.

Works are now being made to develop IGBTs of a gate trench type which can increase a supply capacity of electrons by microscopic processing. However, achievement of high operation speed and low on-voltage unpreferably causes reduction in a breakdown voltage, and therefore it is necessary to improve limits for them.

Referring to FIG. 49, description will be given on a structure of an IGBT of a gate trench type having a high breakdown voltage which has been studied.

FIG. 49 is a schematic cross section of an IGBT of a gate trench type having a high breakdown voltage.

The gate trench type IGBT having a high breakdown voltage includes a lightly doped n⁻ silicon substrate 1 and p-wells 4 which are formed of p-type impurity diffusion regions formed at a first main surface (upper surface in the figure) of n⁻ silicon substrate 1. Gate trenches 70 extending from p-wells 4 into n⁻ silicon substrate 1 are arranged with a certain pitch. Each gate trench 70 is formed of a gate trench groove 7a having a depth similar to the above pitch, a gate insulating film 7 arranged on an inner surface of gate trench groove 7a and a gate electrode 8 arranged inside gate insulating film 7.

At portions of p-wells 4 contiguous to first main surfaces of gate trenches 70, there are arranged n⁺ emitter regions 5 formed of heavily doped n-type impurity diffusion regions.

Portions of gate electrode 8 and gate insulating film 7 of each gate trench 70 which are protruded beyond the first main surface are covered with a silicate glass film 19. There is also formed an emitter electrode 10, which covers entirely the first main surface, is formed of, e.g., a metal film, and is electrically connected to n⁺ emitter regions 5 and p-wells 4.

An n-buffer layer 2 formed of an n⁺ impurity diffusion region is arranged at a second main surface (lower surface in the figure) of n⁻ silicon substrate 1. A p-collector region 3 made of a p⁺ type impurity diffusion region is formed at a surface of n-buffer layer 2. A collector electrode 11 made of, e.g., a metal film is arranged at a surface of p-collector region 3. n-buffer layer 2 which is designed as a so-called punch through type is employed for improving a precision of the semiconductor device, and is not essential.

Operations of the above gate trench type IGBT having a high breakdown voltage will be described below.

First, an operation in an off state will be described below. A voltage is applied across collector electrode 11 and emitter electrode 10 while applying a voltage sufficiently lower than a gate threshold voltage across gate electrode 8 and emitter electrode 10. Thereby, a junction between n⁻ silicon substrate 1 and p-well 4 attains a reversely biased state, and a depletion layer extends mainly toward n⁻ silicon substrate 1. Since the gate potential is low, holes in p-well 4 are attracted to and accumulated at a surfaces of p-well 4 contiguous to gate trench 70, so that the gate trench channel attains an off state.

An operation in an on state will be described below. A voltage is applied across collector electrode 11 and emitter electrode 10 while applying a voltage sufficiently higher than the gate threshold voltage across gate electrode 7 and emitter electrode 10. Thereby, a surface contiguous to gate trench 70 attracts electrons in p-well 4, because the gate potential is high. Therefore, n-inversion occurs, and a trench channel is formed. Thereby, electrons in n⁻ silicon substrate 1 are supplied from n⁺ emitter region 5 into n silicon substrate 1 through the trench channel, and electrons flow toward p-collector layer 3 carrying a positive potential.

When electrons flow into p-collector layer 3, holes are supplied from p-collector layer 3 into n-buffer layer 2. These holes cause conductivity modulation in n⁻ silicon substrate 1. If a life time in n⁻ silicon substrate 1 is sufficiently long, these holes reach the vicinity of the trench channel, and will be attracted into p-well 4 at a lower potential.

Description will now be given on a so-called turn-off state in which the state changes from on state to the off state described above. In an inverter circuit which is typical application of a switching element having a high breakdown voltage, an inductive load is controlled in many cases. FIG. 50 shows results of evaluation of the turn-off operation in a case where the inductive load is controlled in the conventional high-breakdown-voltage IGBT of the gate trench type.

When charges accumulated in the gate capacity decrease and the gate voltage lowers, a sufficient load current may not flow in the high-breakdown-voltage IGBT of the gate trench type, in which case a collector voltage rises. When the collector voltage exceeds 3000 V which is a bus voltage of the inverter circuit, the load current bypasses the IGBT and flows through a bus circuit, so that the collector current in the high-breakdown-voltage IGBT of the gate trench type decreases. When excessive carriers, which were accumulated in n⁻ silicon substrate 1 and n-buffer layer 2 in the high-breakdown-voltage IGBT of the gate trench type during the on state, are discharged or released, the collector current of the high-breakdown-voltage IGBT of the gate trench type flows no longer, and the turn-off operation is completed.

The high-breakdown-voltage IGBT of the gate trench type described above suffers from the following problem in the off state. A current other than a slight leakage current generated inside a depletion layer does not flow between collector electrode 11 and emitter electrode 10, and a high impedance is exhibited.

With increase in collector voltage, the depletion layer further extends to n-buffer layer 2. The electric field in the IGBT increases as the voltage rises. Although the potential at the bottom of gate trench 70 is substantially equal to that at gate electrode 8, the potential, which n⁻ silicon substrate 1 under p-well 4 carries at a position at the same depth as the bottom, rises above the potential at p-well 4 (emitter potential) due to donor ions between the above-mentioned position to p-well 4. In particular, the electric field at a bottom corner in gate trench 70 tends to increase.

In the above state, when the electric field inside the IGBT exceeds a threshold electric field and thereby tends to cause strong impact, a leakage current between collector electrode 11 and emitter electrode 10 rapidly increases, resulting in breakdown of the IGBT.

In order to achieve a high breakdown voltage of the IGBT, therefore, it is necessary to increase a drop voltage which exists in the depletion layer until the electric field reaches the threshold electric field. For this purpose, the thickness of n⁻ silicon substrate 1 is increased so as to lower an impurity concentration. Also, in order weaken the electric field at the lower corner of gate trench 70 and thereby increase the threshold electric field, such a structure has been employed that the gate trench 70 has a round lower corner, or that a distance between gate trenches 70 is reduced (see the following reference 1).

Reference 1: K Matsushita, I Omura and T Ogura, "Blocking Voltage Design Consideration for Deep Trench MOS Gate High Power Devices" Proc., ISPSD' 95 pp. 256–260.

However, reduction in a distance between gate trenches 70 increases an area of gate trenches 70 per unit area, which unpreferably increases the gate capacity and provides a severe limit to processing for fabricating the IGBT.

Then, a problem during the on state will be described below.

A density of electrons and holes in n⁻ silicon substrate 1 increases and a low impedance is attained between collector electrode 11 and emitter electrode 10. However, a relatively large number of holes are attracted into p-well 4. This restricts introduction of electrons from the trench channel into n⁻ silicon substrate 1.

A conventional IGBT, which has been studied for a practical use, exhibits such a carrier density distribution that a carrier density near the collector electrode is higher than that near the emitter electrode as shown in FIG. 51.

The on-voltage can be lowered by strengthening the conductivity modulation of n⁻ silicon substrate 1. The on-voltage lowers in accordance with increase in lifetime of carriers in n⁻ silicon substrate 1, increase in supply of electrons from the trench channel side and increase in supply of holes from p-collector layer 3. Particularly in the IGBT of a class of thousands of volts, supply of an excessively large amount of holes from p-collector layer 3 causes a problem, so that such a design is required that electrons can be supplied from the trench channel side as much as possible.

In order to increase the supply of electrons from the trench channel side, it is necessary to reduce an amount of holes flowing into p-well 4. For achieving this, the following structures have been proposed in the prior art:

(i) Structure in which a pitch of gate trenches is reduced (see reference 2).

(ii) Structure in which gate trenches have a large depth (see reference 2).

(iii) Structure which corresponds to the structure of IGBT shown in FIG. 49 and includes a heavily doped n-type layer under p-well 4.

(iv) Structure in which an emitter contact of p-well 4 and a portion of gate trench 70 not provided with n-emitter region 5 are inserted between trench IGBT portions (see FIG. 50, and references 2 and 3).

Reference 2: M Kitagawa, A Nakagawa, K Matsushita, S Hasegawa, Y Inoue, A Yahata and H Takenaka "4500V IEGTs having Switching Characteristics Superior to GTO" Proc. ISPSD' 95, pp. 485–491.

Reference 3: Japanese Patent Laying-Open No. 7-50405 (1995).

However, if IGBTs were designed as described above, the structures of (i), (ii) and (iv) would suffer from a problem that increase in gate capacity, and the structures of (ii) and (iii) would suffer from a problem of lowering of breakdown voltages. The former problem is geometrically apparent from the fact that an area ratio of the gate insulating film is large. An example of the latter problem will be described below with reference to FIG. 53, which shows results of evaluation of breakdown voltages and saturation voltages in IGBTs of a class of 4500 volts with various heavily doped n-type layers formed at various depths under p-wells 4 and having different impurity concentrations. As structure parameters of the reference IGBT for the above evaluation, the impurity concentration of n⁻ silicon substrate 1 is $1.3 \mathrm{e} 13/\mathrm{cm}^3$, a thickness is 625 μm, a pitch of gate trenches 70 is 5 μm and a depth thereof is 5 μm.

As shown in FIG. 53, the saturation voltage is certainly lower than that of the reference IGBT (represented as reference TIGBT in the table). However, as the saturation voltage decreases to a higher extent, the breakdown voltage also decreases to a higher extent, so that it is impossible to find practically acceptable conditions of the impurity concentration and the position of the n-type layer.

A problem caused by the turn-off operation will be described below.

Referring again to FIG. 50, there is a range indicated by Z in the figure, in which the rapidly raised collector voltage ($V_{CE}$) of about 1200 V rises slowly to about 3000 V. With reference to a cumulative waveform of a switching loss ($E_{OFF}$) represented by broken line, a major portion of turn-on loss is consumed at the range indicated by Z.

As characteristics of IGBT shown in FIG. 50, there are shown waveforms of an element of which saturation voltage is set to about 3 V by controlling introduction of holes from p-collector layer 3. The structure parameters are as follows. The impurity concentration of silicon substrate is $1.0 \mathrm{e} 13/\mathrm{cm}^3$, a thickness is 425 μm, a gate trench pitch is 5.3 μm, a depth is 5 μm and a width is 1 μm.

The above phenomenon has been elucidated as follows by analyzing an internal state of the IGBT used for the device simulation. When carriers accumulated in the IGBT are discharged and the collector voltage rises, the depletion layer does not extend rapidly from the emitter electrode side if a large amount of carriers are accumulated at a neutral region of n⁻ silicon substrate 1 near the collector electrode, so that the collector voltage rises slowly.

At the same time, the following phenomenon occurs. A difference in charge density between holes and electrons forming a current acts to modulate and therefore enhance the electric field in the depletion layer, and impact-generated carriers transitionally supply an electron current, which delays turn-off.

In order to suppress the above phenomenon for reducing the turn-off loss, it is necessary to employ a design which can avoid excessive accumulation of carriers at the neutral region in n⁻ silicon substrate 1 near the collector electrode in the on state. However, mere suppression of introduction of holes from p-collector layer 3 would result in rise of the saturation voltage and therefore increase in the on-state loss.

SUMMARY OF THE INVENTION

An object of the invention is provide a semiconductor device having a high breakdown voltage, which can achieve a high breakdown voltage without increasing a gate capacity in an off state of a high-breakdown-voltage IGBT of a gate trench type, and a method of manufacturing the same.

Another object of the invention is provide a semiconductor device having a high breakdown voltage, which can reduce a saturation voltage without reducing a breakdown voltage in an on state of a high-breakdown-voltage IGBT of a gate trench type, and a method of manufacturing the same.

A still another object of the invention is provide a semiconductor device having a high breakdown voltage, which can reduce a turn-off loss in a turn-off operation of a high-breakdown-voltage IGBT of a gate trench type, and a method of manufacturing the same.

According to an aspect of the invention, a semiconductor device with a high breakdown voltage includes a semiconductor substrate of a first conductivity type having first and second main surfaces; a first impurity layer of a second conductivity type formed at the first main surface; a gate trench formed of a groove extending from the first impurity layer into the semiconductor substrate, a gate insulating film covering an inner surface of the groove, and a gate electrode filling the groove and formed of an electric conductor; a pair of impurity regions of the first conductivity type formed near a surface of the first impurity layer and located at opposite sides of the gate trench; a first main electrode layer formed over the first main surface, opposed to the gate trench with an insulating film therebetween and electrically connected to the impurity region and the first impurity layer; a second impurity layer of the second conductivity type formed at the second main surface; and a second main electrode layer formed at a surface of the second impurity layer. The gate trench is formed at each of positions spaced with a predetermined pitch. An insulating layer is arranged at a position in the semiconductor substrate located between the gate trenches.

Further, according to a method of an aspect of the invention and more specifically a method of manufacturing a semiconductor device with a high breakdown voltage, a step is performed for preparing a first semiconductor substrate of a first conductivity type provided at its main surface with an insulating layer. Thereafter, a second semiconductor substrate of the first conductivity type is arranged over the insulating layer to form a semiconductor substrate having first and second main surfaces and including the insulating layer interposed therebetween.

Then, a first impurity layer of the second conductivity type is formed at the first main surface of the semiconductor substrate. Thereafter, an impurity region of the first conductivity type is formed at a predetermined region of a surface of the first impurity layer.

Then, a second impurity layer of the second conductivity type is formed at the second main surface. Thereafter, a groove extending to the insulating layer is formed at the impurity region.

Then, the insulating layer exposed at the groove is removed. Thereafter, an epitaxial growth layer having the same impurity concentration as the semiconductor substrate is formed at an inner surface of the groove by an epitaxial growth method.

Then, a gate insulating film is formed at a surface of the epitaxial growth layer in the groove. Thereafter, the groove is filled with an electric conductor to form a gate electrode.

Then, a portion of the gate electrode exposed at the first main surface is covered with an insulating film. Thereafter, a step is performed to form a first main electrode layer covering the first main surface and electrically connected to the first impurity layer and the impurity region. Thereafter, a second main electrode layer is formed at the second main surface.

In a method of manufacturing a semiconductor device with a high breakdown voltage according to another aspect of the invention, a step is performed to form a first semiconductor substrate of a first conductivity type provided at its main surface with insulating layers with a predetermined pitch. Thereafter, a step is performed to form a second semiconductor substrate of the first conductivity type provided at its main surface with concavities of the same width and thickness as the insulating layer with the same pitch as the insulating layers at the main surface.

Then, the main surfaces of the first and second semiconductor substrates are laminated together to form a semiconductor substrate having first and second main surfaces and including the insulating layers interposed therebetween with a predetermined pitch. Thereafter, a first impurity layer of a second conductivity type is formed at the first main surface of the semiconductor substrate.

Then, an impurity region of the first conductivity type is formed at a predetermined region of the surface of the first impurity layer. Thereafter, a second impurity layer of the second conductivity type is formed at the second main surface.

Then, a groove extending to the semiconductor substrate through a region between the insulating layers are formed at the impurity region. Thereafter, a gate insulating film is formed at an inner surface of the groove.

Then, the groove is filled with an electric conductor to form a gate electrode. Thereafter, a portion of the gate electrode exposed at the first main surface is covered with an insulating film.

A step is performed to form a first main electrode layer electrically connected to the first impurity layer and the impurity region and covering the first main surface. Thereafter, a second main electrode layer is formed at the second main surface.

According to the semiconductor device with a high breakdown voltage and the method of manufacturing the same described above, the insulating layer is arranged at the position in the semiconductor substrate between the gate trenches.

This insulating layer functions as a kind of capacitor during the off state of the semiconductor device having a high breakdown voltage. Electrons are attracted to the upper surface of the insulating layer to form strongly negative space charges. These strongly negative space charges intercept an electric field which would be gradually enhanced by donor ions and would be applied from the lower side of the semiconductor substrate toward the first impurity layer, so that an electric field is not substantially present between the insulating layer and the first impurity layer. Thereby, the potential on the upper surface of the insulating layer lowers to a potential substantially equal to that on the first main electrode connected to the first impurity layer.

Meanwhile, the interior of the gate trench carries a potential not higher than that on the first main electrode, and an electric field is enhanced at a corner of the bottom of the gate trench. However, if an end of the insulating layer is close to the corner of the bottom of the gate trench, a potential difference between them is small and the electric field is weakened, because the potential under the insulating layer is low. Consequently, the breakdown voltage can be improved.

During the on state of the semiconductor device having a high breakdown voltage, the insulating layer functions to prevent attraction of holes into the first impurity layer. Since the gate trench is strongly and positively biased, electrons are attracted to a wall of the gate trench, and holes are repelled, so that holes cannot easily pass between the wall of gate trench and the insulating layer, and cannot substantially arrive at the first impurity layer. Therefore, the hole current decreases and an efficiency of introduction of electrons from the trench channel increases, so that a great amount of electrons and holes are supplied to the semiconductor substrate, increasing the conductance. Therefore, the saturation voltage can be reduced.

In addition, when this semiconductor device having a high breakdown voltage is employed as an IGBT, increase in carrier density within the semiconductor substrate of the first conductivity type at on state would lead to increase in conductivity of this semiconductor substrate and decrease in saturation voltage. At this time, however, if the hole supply from the impurity layer of the second conductivity type is reduced to recover the saturation voltage, the exhibited distribution of the carrier density would be such that it is higher at the side of the first main electrode than at the side of the second main electrode.

When the semiconductor device with a high-breakdown-voltage is turned off, the gate voltage lowers, and the channel cannot supply a sufficient amount of electrons, so that the voltage on the second main electrode layer starts to rise. When this rise starts, excessive holes which have been accumulated in the semiconductor substrate are attracted toward the gate trench at a low voltage, move along the wall of the gate trench to the first impurity layer, and then flow into the first main electrode layer.

Since a large current would not flow through a portion located under the first impurity layer and surrounded by the gate trenches even if insulating layer were not present at this portion, the insulating layer existing at this portion does not cause a particular problem. During the on state, if an element having a carrier distribution indicated by solid line is turned off, holes which are relatively large in amount near the first main electrode layer are discharged from the first main electrode side, so that the depletion layer formed by discharge of holes extends only slowly at an initial stage in the turn-off operation, and the second main electrode voltage starts to rise relatively slowly.

However, when the second electrode voltage rises and the depletion layer extends to some extent, the end of the depletion layer is located at a region in which only a small amount of initially accumulated carriers are present, and the depletion layer extends rapidly owing to discharge or release of holes. Thereby, the collector voltage rapidly rises until the end of the turn-off operation. Consequently, the turn-off loss is reduced, and thereby it is possible to suppress increase in the temperature inside the semiconductor device with a high breakdown voltage.

According to still another aspect of the invention, a semiconductor device with a high breakdown voltage includes a semiconductor substrate of a first conductivity type having first and second main surfaces; a first impurity layer of a second conductivity type formed at the first main surface; a gate trench having a first groove extending from the first impurity layer into the semiconductor substrate, a gate insulating film covering an inner surface of the first groove, and a gate electrode filling the first groove and made of an electric conductor; a pair of impurity regions of the first conductivity type formed near a surface of the first impurity layer and located at opposite sides of the gate trench; a first main electrode layer covering the first main surface, opposed to the gate trench with an insulating film therebetween and electrically connected to the impurity region and the first impurity layer; a second impurity layer of the second conductivity type formed at the second main surface; and a second main electrode layer formed at a surface of the second impurity layer. The gate trench is formed at each of positions spaced from each other with a predetermined pitch. At a position in the semiconductor substrate located between the gate trenches, there is arranged an emitter trench having a second groove extending from the first impurity layer into the semiconductor substrate, an insulating film covering an inner surface of the second groove, and a second electrode filling the second groove and electrically connected to the first main electrode layer.

According to yet another aspect of the invention, a method of manufacturing a semiconductor device with a high breakdown voltage includes a step of preparing a semiconductor substrate of a first conductivity type having first and second main surfaces. Thereafter, a first impurity layer of a second conductivity type is formed at the first main surface of the semiconductor substrate.

A plurality of impurity regions of the first conductivity type are formed at predetermined regions in a surface of the first impurity layer, respectively. Thereafter, a second impurity layer of the second conductivity type is formed at the second main surface.

Then, a first groove extending to the semiconductor substrate is formed at the impurity region. Thereafter, a second groove extending to the semiconductor substrate is formed at a portion of the first impurity layer.

First insulating films are formed at inner surfaces of the first and second grooves. Thereafter, the first and second grooves are filled with electric conductors to form a buried gate electrode and a buried emitter electrode.

Portions of the buried gate electrode and the buried emitter electrode exposed at the first main surface are covered with a second insulating film. Thereafter, a contact hole extending to the buried emitter electrode is formed at the second insulating film formed on the buried emitter electrode.

Then, a step is performed to form a first main electrode layer covering the first main surface and electrically connected to the first impurity layer, the impurity region and the buried emitter electrode. Thereafter, a second main electrode layer is formed at the second main surface.

According to the semiconductor device with a high breakdown voltage and the method of manufacturing the same described above, the emitter trench set to the same potential as the first main electrode is arranged between the gate trenches.

The above structure can further reduce the saturation voltage, and can increase the amount of carriers introduced into the semiconductor substrate. Also, the structure can slightly increase the breakdown voltage. Therefore, a performance of the semiconductor device with a high breakdown voltage can be improved.

According to this structure, since the emitter trench is set to a potential equal to that of the first main electrode, a unit area of the gate trenches is small, so that the gate capacity can be significantly reduced. In particular, reduction in the capacity (feedback capacity) between the gate trench and the second main electrode layer allows rapid switching, and therefore can achieve an effect of reducing a switching loss. This is strongly demanded in the semiconductor device with a high breakdown voltage, of which purpose is to handle a large power, and reduction in the gate capacity is strongly demanded for simplifying driving circuit and improving response time. Therefore, the above point is very important.

According to further another aspect of the invention, a semiconductor device with a high breakdown voltage includes a semiconductor substrate of a first conductivity type having first and second main surfaces; a first impurity layer of a second conductivity type formed at a predetermined region in the first main surface; a gate trench having a first groove formed at the region provided with the first impurity layer and extending from the first impurity layer to the semiconductor substrate, a gate insulating film covering an inner surface of the first groove and an electrode filling the first groove and made of an electric conductor; a pair of impurity regions of the first conductivity type formed near a surface of the first impurity layer with the gate trench therebetween; a first main electrode layer opposed to the gate trench with an insulating film therebetween, electrically connected to the impurity region and the first impurity layer and covering the first main surface; a second impurity layer of the second conductivity type formed at the second main surface; and a second electrode layer formed at the second impurity layer. The gate trench is formed at each of positions spaced from each other with a predetermined pitch. At positions between the gate trenches and spaced from each other with a predetermined pitch, there are arranged a plurality of emitter trenches each having a second groove extending from the first impurity layer into the semiconductor substrate, an insulating film covering an inner surface of the second groove, and a second electrode filling the second groove and electrically connected to the first main electrode layer.

According to a further aspect of the invention, a method of manufacturing a semiconductor device with a high breakdown voltage includes a step of preparing a semiconductor substrate of a first conductivity type having first and second main surfaces.

Then, an impurity region of the first conductivity type is formed at a predetermined region of the first main surface. Thereafter, a second impurity layer of the second conductivity type is formed at the second main surface. Then, a first groove extending to the semiconductor substrate is formed at a predetermined position in the impurity region. Thereafter, a plurality of second grooves are formed at the semiconductor substrate defined by the impurity region.

First insulating films are formed at inner surfaces of the first and second grooves. Thereafter, the first and second grooves are filled with electric conductors to form a buried gate electrode and a buried emitter electrode, respectively.

Portions of the buried gate electrode and the buried emitter electrode exposed at the first main surface are covered with a second insulating film. Thereafter, a contact hole extending to the buried emitter electrode is formed at the second insulating film formed on the buried emitter electrode.

Then, a step is performed to form a first main electrode layer covering the first main surface and electrically connected to the semiconductor substrate, the impurity region and the buried emitter electrode. Thereafter, a second main electrode layer is formed at the second main surface.

According to the semiconductor device with a high breakdown voltage and the method of manufacturing the same described above, a plurality of emitter trenches which are set to the same potential as the first main electrode layer are disposed between the gate trenches. Owing to this structure, it is possible to reduce a ratio of a distance between the gate trench and the emitter trench with respect to the pitch of the gate trenches to a necessary value, even if the gate trench and the emitter trench have the same configuration. Therefore, the semiconductor device can be manufactured easily.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (Embodiment 1)

Description will now be given on a semiconductor device with a high breakdown voltage and a method of manufacturing the same according to an embodiment 1 of the invention.

Figure 1:
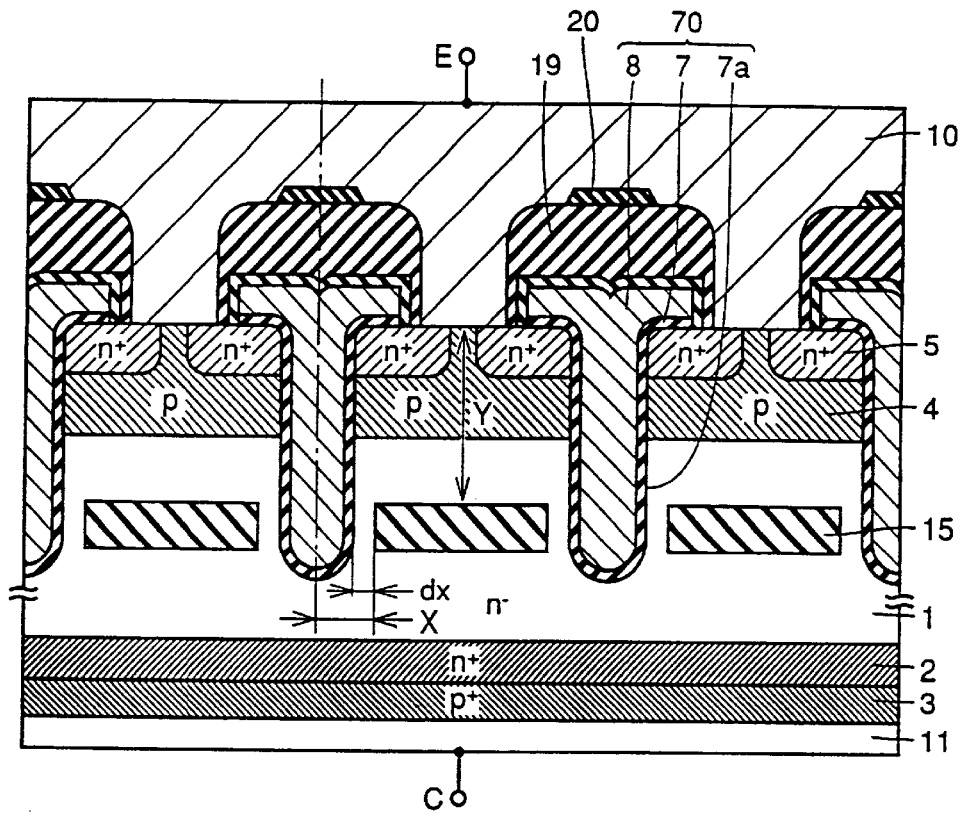
FIG. 1 is a cross section showing a structure of a high-breakdown-voltage IGBT of a gate trench type according to an embodiment 1 of the invention.

Referring to FIG. 1, a sectional structure of an IGBT of a gate trench type with a high breakdown voltage will be discussed below as an example of the semiconductor device with a high breakdown voltage of the embodiment 1. The high-breakdown-voltage IGBT of the gate trench type (will also be referred to merely as an "IGBT" hereinafter) includes a lightly doped n$^-$ silicon substrate 1. p-well 4 made of a p-type impurity diffusion region is formed at a first main surface (upper surface in FIG. 1) of the silicon substrate 1.

Gate trenches 70 are formed at n$^-$ silicon substrate 1 with a predetermined pitch. Each gate trench 70 is formed of a gate trench groove 7a, which is slightly deeper than p-well 4 and extends through the first main surface to a position at a depth similar to the above-mentioned pitch, a gate insulating film 7 arranged on an inner surface of gate trench groove 7a and made of an oxide film, and a gate electrode 8 arranged inside gate insulating film 7.

An n$^+$ emitter region 5 made of a heavily doped n-type impurity diffusion region is formed at a surface of p-well 4 contiguous to the first main surface of each gate trench 70. Portions of gate electrode 8 and insulating film 7 exposed at the first main surface are covered with an interlayer insulating film 19 made of, e.g., an oxide film. There is also arranged an emitter electrode 10, which is electrically connected to emitter regions 5 and p-wells 4, covers the first main surface and is made of, e.g., a metal film.

An n-buffer layer 2 made of an n-type impurity diffusion region is arranged at a second main surface (lower surface in the figure) of silicon substrate 1, and a p-collector layer 3 made of a p-type impurity diffusion region is arranged at the surface of n-buffer layer 2. A collector electrode 11 made of, e.g., a metal film is formed at the surface of p-collector layer 3. The purpose of n-buffer layer 2 is to improve a performance in a design of a so-called punch through type, and is not essential.

As a distinctive feature in the structure of IGBT according to the embodiment 1, an insulating layer 15 made of a silicon oxide film is arranged at each of regions of n$^-$ silicon substrate 1 located between gate trenches 70.

Structural parameters of the IGBT shown in FIG. 1 are as follows. The impurity concentration of n$^-$ silicon substrate 1 is $1.0e13/cm^3$, and a thickness (D) of n-silicon substrate is 425 $\mu$m. The pitch of gate trenches is 5.3 $\mu$m. A depth (d) and a width (W) of gate trench 70 are 5 $\mu$m and 1 $\mu$m, respectively.

A thickness (Y') and a position (dx) of insulating layer 15 are important factors determining characteristics of the IGBT.

Figure 2:
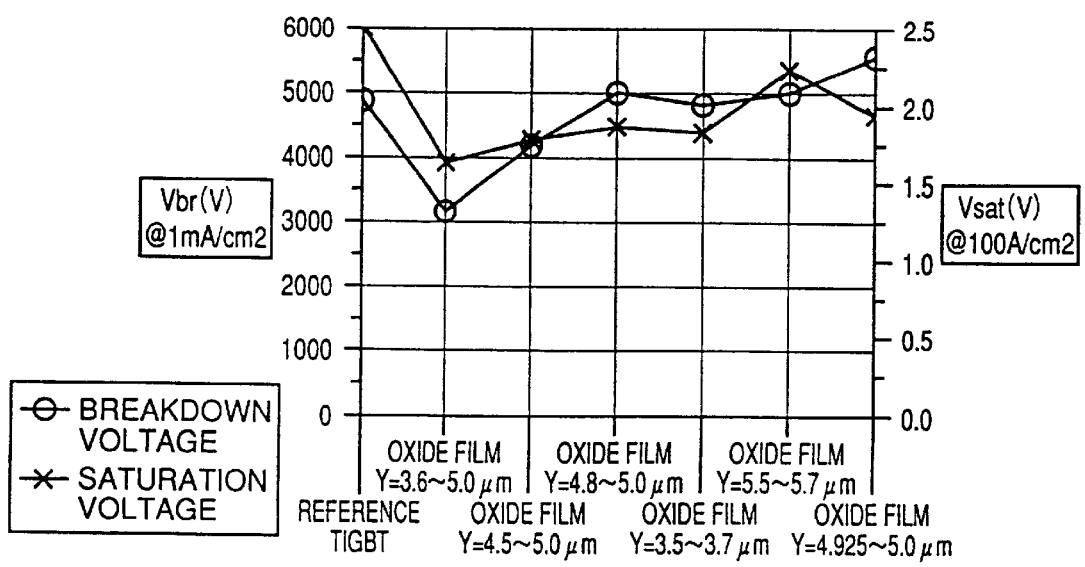
FIG. 2 shows dependency of a breakdown voltage and a saturation voltage on vertical specifications of an insulating layer 1 in the embodiment 1 of the invention.

FIG. 2 shows results of evaluation of variation in a breakdown voltage and a saturation voltage corresponding to variation in longitudinal position (Y) of insulating layer 15. A reference TIGBT in FIG. 2 represents the results of IGBT shown in FIG. 47 and therefore not provided with insulating layer 15.

It can be seen from FIG. 2 that provision of insulating layer 15 reduces the saturation voltage, but the vertical position (Y) of insulating layer 15 is preferably at a level higher than the bottom of gate trench 70 for improving the saturation voltage.

Meanwhile, insulating layer 15 having a thickness (Y') substantially lower than 0.3 $\mu$m can improve the breakdown voltage as compared with the conventional structure of IGBT.

With respect to the thickness (Y') of insulating layer 15, a relationship of tradeoff is found between the breakdown voltage and the saturation voltage to a certain extent, but a thinner insulating layer 15 is preferable because the breakdown voltage takes priority over the other in the IGBT.

In the data shown in FIG. 2, since gate insulating film 7 in gate trench 70 has a thickness of 0.075 $\mu$m, an appropriate relationship in thickness between gate insulating film 7 and insulating layer 15 is that the thickness of insulating layer 15 is substantially smaller than a quadruple of that of gate insulating film 7. In this example, a distance (dx) from a wall surface of gate trench 70 to insulating layer 15 is 0.2 $\mu$m.

Figure 3:
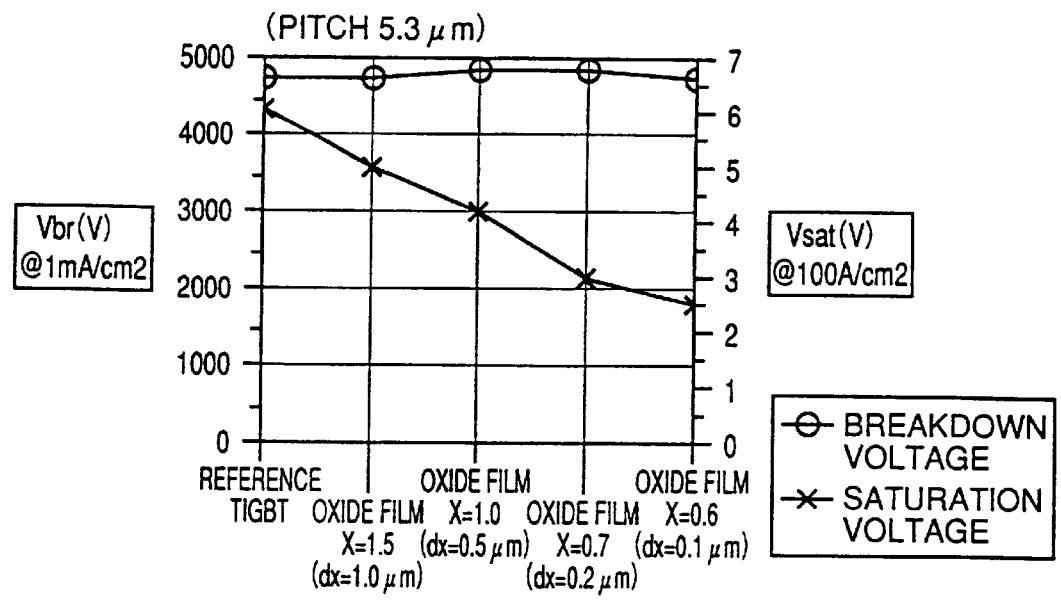
FIG. 3 shows dependency of a breakdown voltage and a saturation voltage on lateral specifications of an insulating layer 1 in the embodiment 1 of the invention.

FIG. 3 shows results of evaluation of variation in the breakdown voltage and saturation voltage corresponding to variation in lateral position (X) of insulating layer 15. It can be understood from data shown in FIG. 3 that a shorter distance (dx) from the wall surface of gate trench 70 to insulating layer 15 enhances an effect of reducing the saturation voltage, and the breakdown voltage which exhibit a slight variation takes on the maximum value with dx of about 0.2 $\mu$m.

Figure 4:
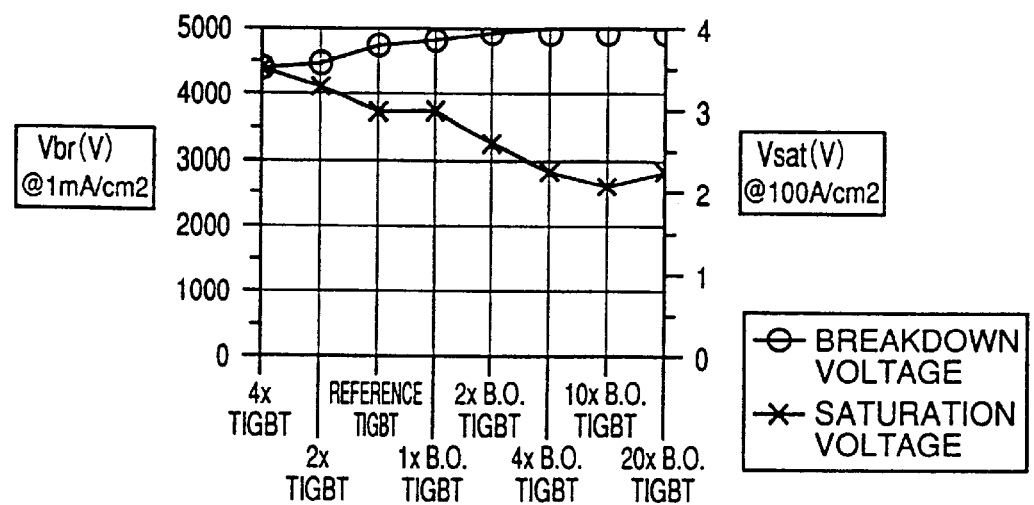
FIG. 4 shows dependency of a breakdown voltage and a saturation voltage on specifications of a gate trench pitch in the embodiment 1 of the invention and the conventional IGBT.
Figure 47:
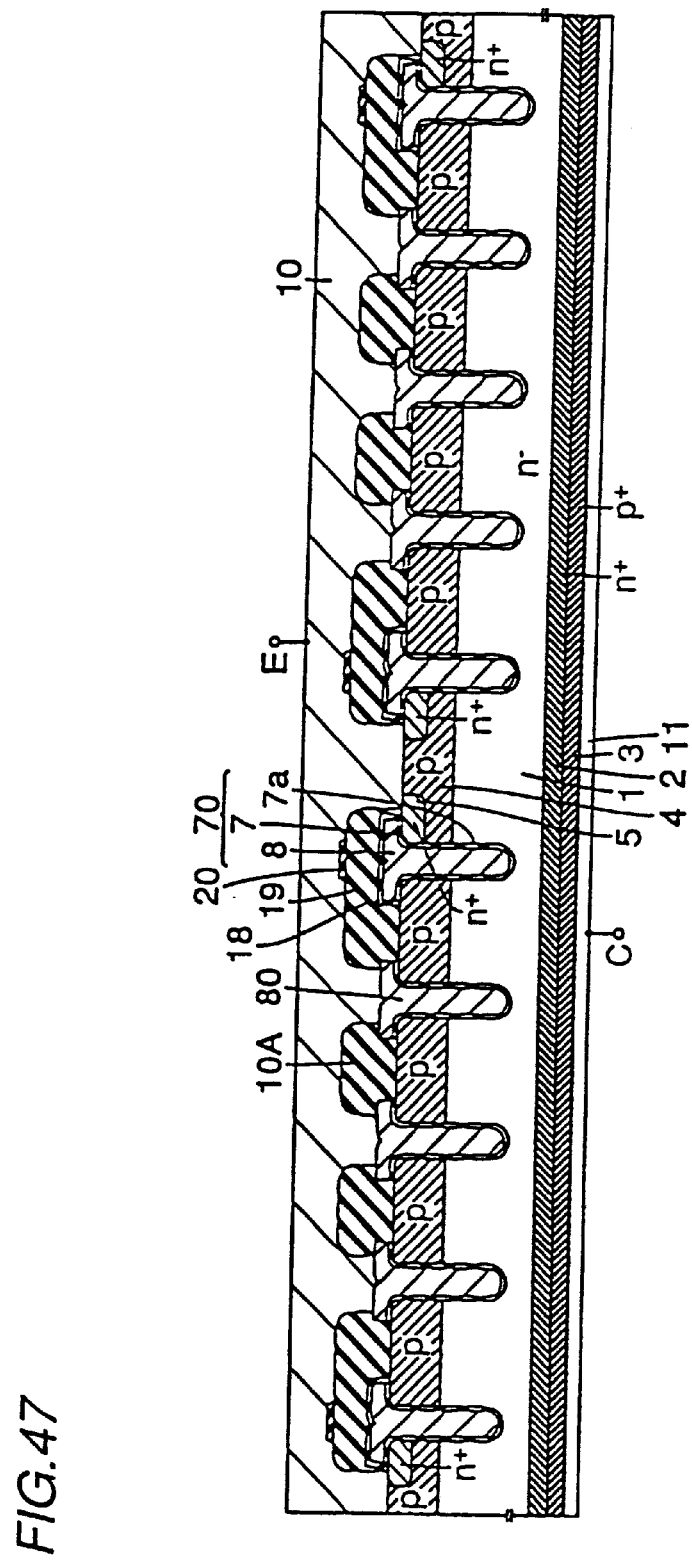
FIG. 47 is another first cross section showing a high-breakdown-voltage IGBT of a gate trench type according to embodiment 3 of the invention.

For the structure of the conventional IGBT shown in FIG. 47 and the structure of the IGBT of the embodiment 1 shown in FIG. 1, variation in the breakdown voltage and saturation voltage was evaluated with various values of pitch of gate trenches 70. The results are shown in FIG. 4. In FIG. 4, 2×TIGBT indicates a result obtained when the pitch of trench gates 70 was doubled in the conventional IGBT shown in FIG. 47, and 2×B.O.TIGBT indicates a result obtained when the pitch was doubled in the IGBT shown in FIG. 1.

It can be seen from FIG. 4 that, as the pitch of the gate trenches 70 increases in the IGBT of the conventional structure, the saturation voltage increases and the breakdown voltage decreases, resulting in reduction in the performance of the IGBT. In the structure of IGBT of the embodiment, increase in the pitch can improve the breakdown voltage, although the improvement is achieved only to a slight extent. As it increases to about 10 times (53 μm in this embodiment), the saturation voltage decreases, and then the saturation voltage increases as it increases to 20 times.

It is already found that, if the interface recombination speed between insulating layer 15 and n⁻ silicon substrate 1 is large, the pitch which minimizes the saturation voltage is small, and the effect of reducing the saturation voltage is small.

Figure 5:
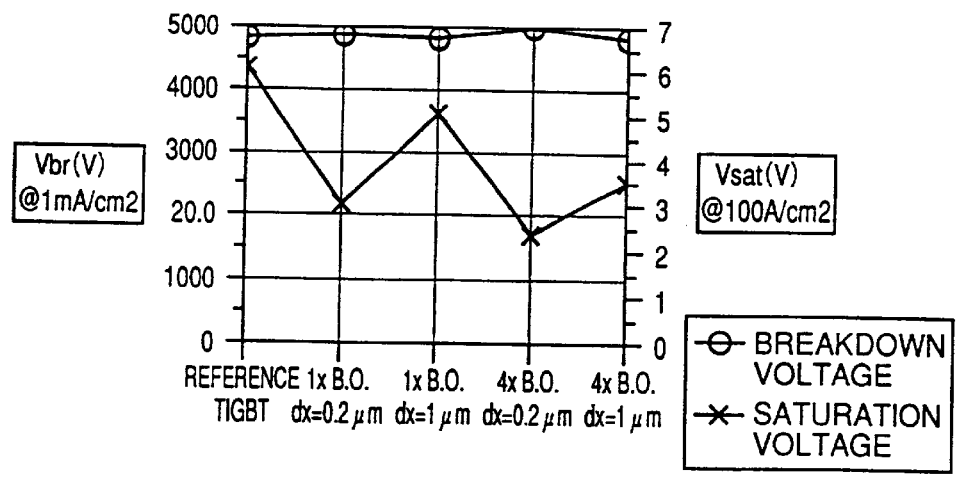
FIG. 5 shows dependency of a breakdown voltage and a saturation voltage on a gate trench pitch and lateral specifications of an insulating layer in the embodiment 1 of the invention.

FIG. 5 shows results of evaluation of variation in the breakdown voltage and the saturation voltage corresponding to variation in combination of the pitch of gate trenches 70 and distance (dx) from the side wall of gate trench 70 to insulating layer 15.

As can be seen from FIG. 5, when the pitch of gate trenches 70 is 5.3 μm, the saturation voltage increases in accordance with increase of dx to 1 μm. By increasing the pitch of gate trenches 70 fourfold, however, the saturation voltage can be improved to a value similar to that attained with the pitch of 5.3 μm and dx of 0.2 μm.

Therefore, when the gate trench 70 and insulating layer 15 are to be formed in a non-self-alignment manner in the method of manufacturing the IGBT, it is necessary to increase dx in some cases. Even in these cases, if dx is substantially smaller than 1 μm, an intended performance of the IGBT can be ensured.

As described above, distance dx between insulating layer 15 and the wall surface of gate trench 70 must be much shorter than the pitch of gate trenches 70 in order to improve the carrier density. When dx is nearly one-twentieth of the pitch, a sufficient effect can be achieved. Even if dx cannot be reduced due to allowable processing accuracy, a sufficient effect can be achieved with dx nearly equal to one tenth of the gate trench pitch.

Figure 6:
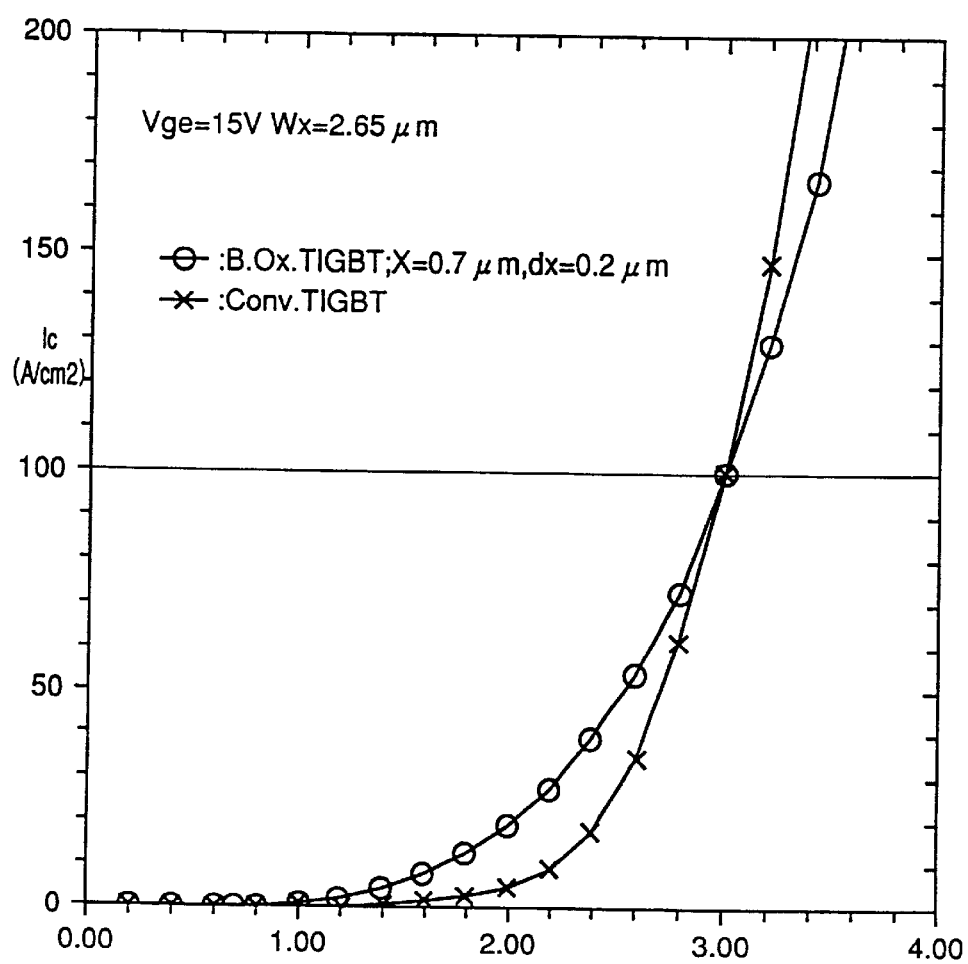
FIG. 6 shows saturation voltage characteristics of the structure of the embodiment 1 of the invention and the conventional structure for comparison.

Based on the characteristics of the IGBT of this embodiment described above, a high-breakdown-voltage IGBT of the gate trench type was prepared using one of combinations of parameters including the optimized breakdown voltage and the optimized saturation voltage. The saturation voltage characteristics of this high-breakdown-voltage IGBT of the gate trench type were compared with those of the IGBT having a conventional structure. Results are shown in FIG. 6 as waveform with circles. In the IGBT of this embodiment, gate trenches 70 are arranged with a pitch of 5.3 μm, and each have a depth of 5 μm and a width of 1 μm. X is 0.7 μm, and dx is 0.2 μm. The insulating layer has thickness (Y') of 0.2 μm and depth (Y) of 3.5 μm. Introduction of holes from p-collector layer 3 is controlled to set the saturation voltage to about 3 V with the collector current density of 100 A/cm².

As can be seen from FIG. 6, the IGBT of this embodiment can advantageously reduce the saturation voltage at low current density, and the on-state loss with a practical current density (lower than the rating), which must be taken into consideration for application to practical circuits, can be reduced.

Figure 7:
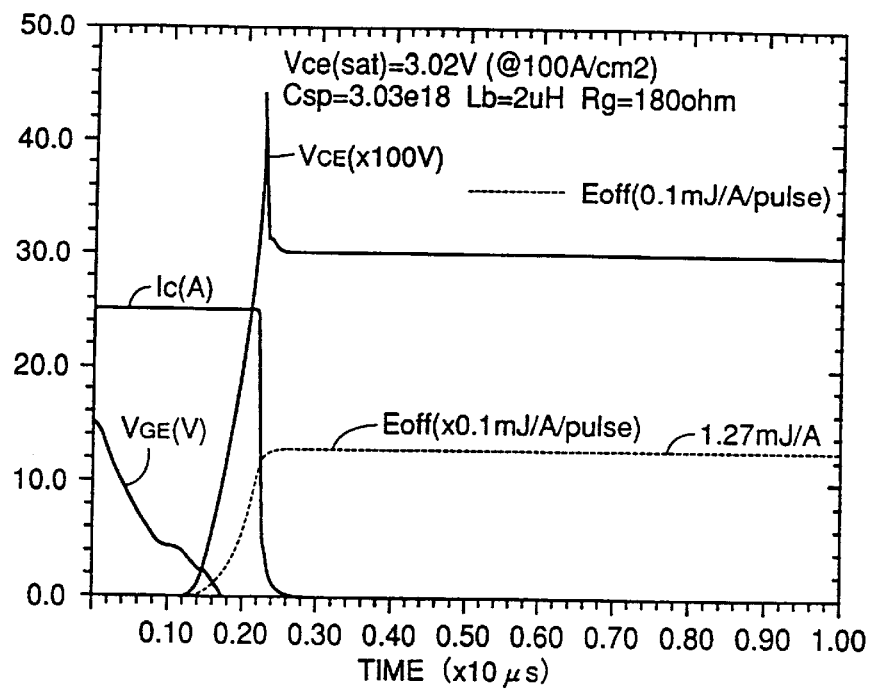
FIG. 7 shows inductive load turn-off characteristics in the embodiment 1 of the invention.

The turn-off operation of the inductive load was evaluated with the IGBT described above. The results are shown in FIG. 7. As compared with the evaluation of the conventional structure shown in FIG. 48, the turn-off loss is reduced to about 40% although nearly equal saturation voltages are used.

In particular, such a problem of the conventional structure is substantially overcome that delay in voltage rise occurs at an area of the collector voltage (Vce) higher than about 1200 V. The internal temperature rise during a period from the on-state to completion of the turn-off state was calculated. From results of this calculation, It was also found that the temperature rise in the IGBT of the embodiment was smaller by about 40% than that in the conventional IGBT.

A first practical example of a method of manufacturing the IGBT according to the above embodiment 1 will be described below with reference to FIGS. 9 to 20, which show sectional structures of the IGBT shown in FIG. 1 at various steps, respectively.

Figure 9:
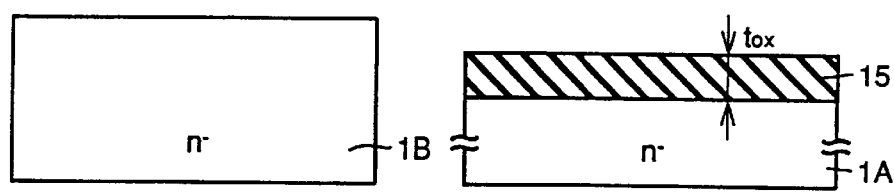
FIGS. 9 to 20 are cross sections showing 1st to 12th steps for manufacturing the high-breakdown-voltage IGBT of the gate trench type of the embodiment 1 of the invention, respectively.

Referring first to FIG. 9, insulating layer 15 having a thickness of $t_{ox}$ and made of an oxide film is formed on an n⁻ silicon substrate 1A having a thickness from 400 to 630 μm and an impurity concentration from 200 to 1000 Ω·cm. Insulating layer 15 is formed by wet or dry oxidation under the condition from 820 to 1215° C. Film thickness $t_{ox}$ of insulating layer 15 is preferably equal to or smaller that a quadruple of that of gate insulating film 7 formed in gate trench 70.

There is also prepared an n⁻ silicon substrate 1B from 3 to 50 μm in thickness having the same impurity concentration as n⁻ silicon substrate 1A.

Figure 10:
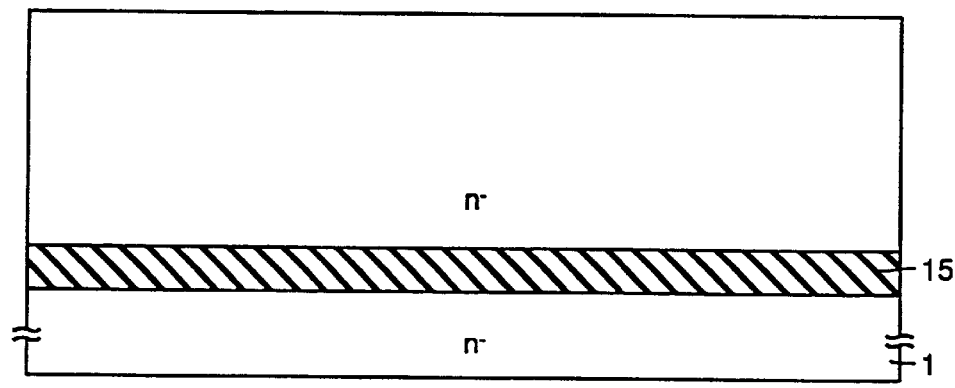

Referring to FIG. 10, silicon substrate 1B is laminated over insulating layer 15 on n⁻ silicon substrate 1A to complete n⁻ silicon substrate 1.

Surfaces at the upper and lower sides of n⁻ silicon substrate 1 will be referred to as first and second main surfaces, respectively.

Figure 11:
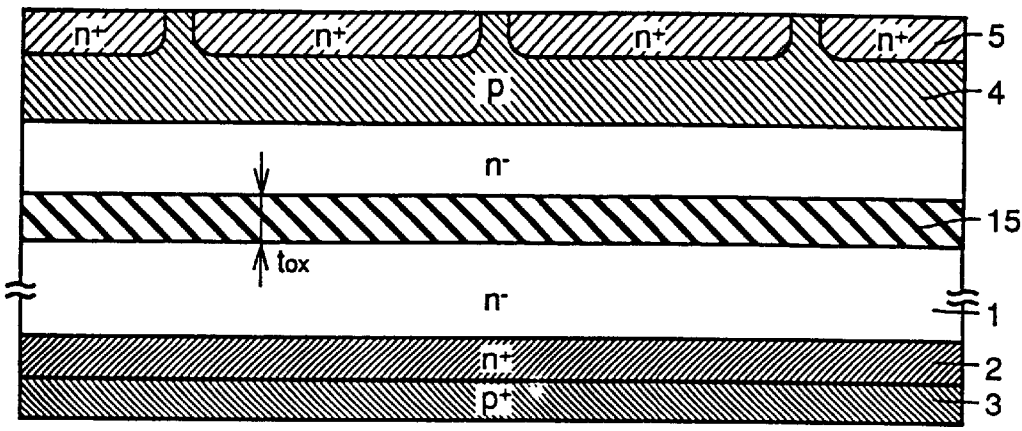

Referring to FIG. 11, p-well 4 which is formed at a depth from 1.5 to 4.0 μm and has a peak concentration of p-type impurity from $1 \times 10^{15}$ to $5 \times 10^{18}$ cm⁻³ is formed at the first main surface of silicon substrate 1. n⁺ emitter regions 5 having a depth from 0.8 to 2.0 μm and a surface impurity concentration from $1 \times 10^{19}$ to $1 \times 10^{20}$ cm⁻³ are formed at predetermined regions in the surface of p-well 4.

At and near the second main surface of n⁻ silicon substrate 1, n⁺ buffer layer 2 and p⁺ collector electrode 3 are formed. n⁺ buffer layer 2 has a depth from 10 to 30 μm and a peak impurity concentration from $1 \times 10^{14}$ to $1 \times 10^{18}$ cm⁻³. p⁺ collector layer 3 has a peak impurity concentration higher than that of n⁺ buffer layer 2.

Figure 12:
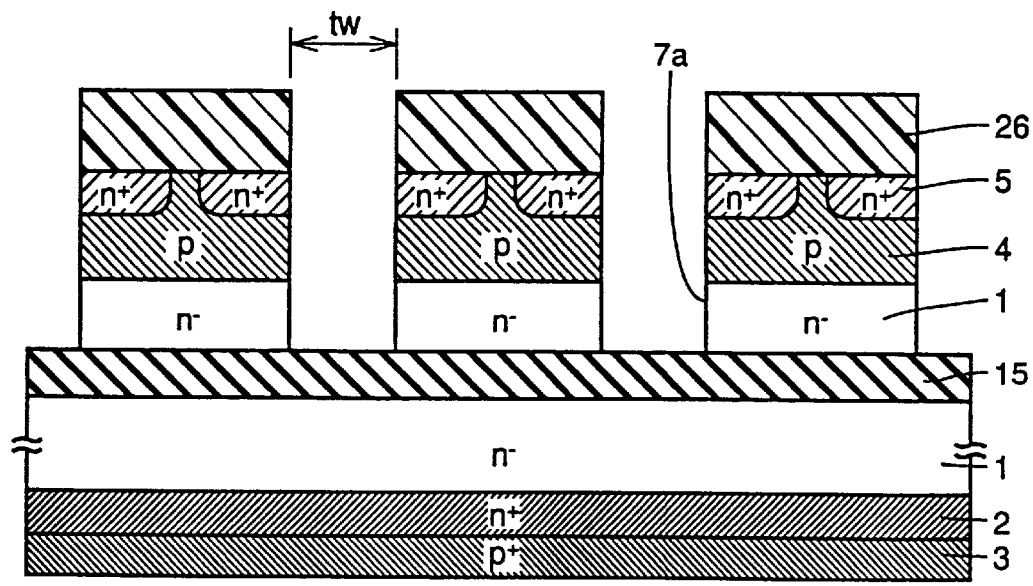

Referring to FIG. 12, oxide film 26 having a predetermined pattern is formed on p-well 4. Using oxide film 26 as a mask, anisotropic dry etching is effected to open gate trench grooves 7a reaching insulating layer 15. Each gate trench groove 7a thus formed has a width ($t_w$) from about 0.8 to about 3.0 μm and a depth from about 3.0 to about 15.0 μm. The depth of gate trench groove 7a is a parameter depending on thickness ($t_{ox}$) of insulating layer 15.

Figure 13:
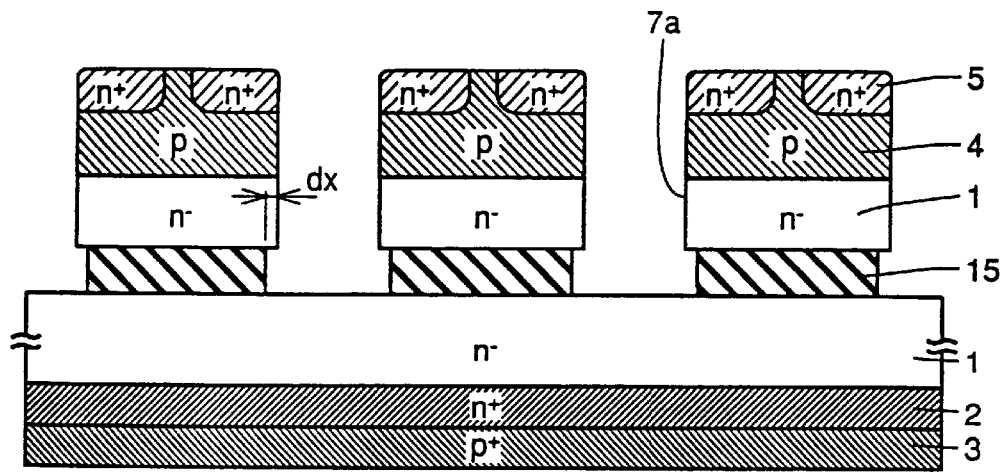

Referring to FIG. 13, a deposition film (not shown) formed at gate trench groove 7a is removed after formation of gate trench groove 7a shown in FIG. 12. In this step, each edge of the oxide film forming insulating layer 15 is also removed laterally by a length dx.

Figure 14:
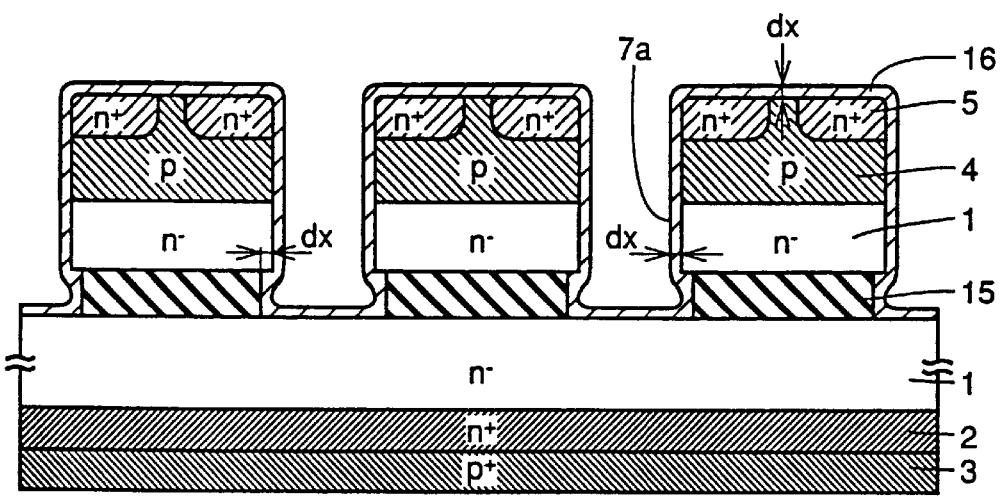
Figure 15:
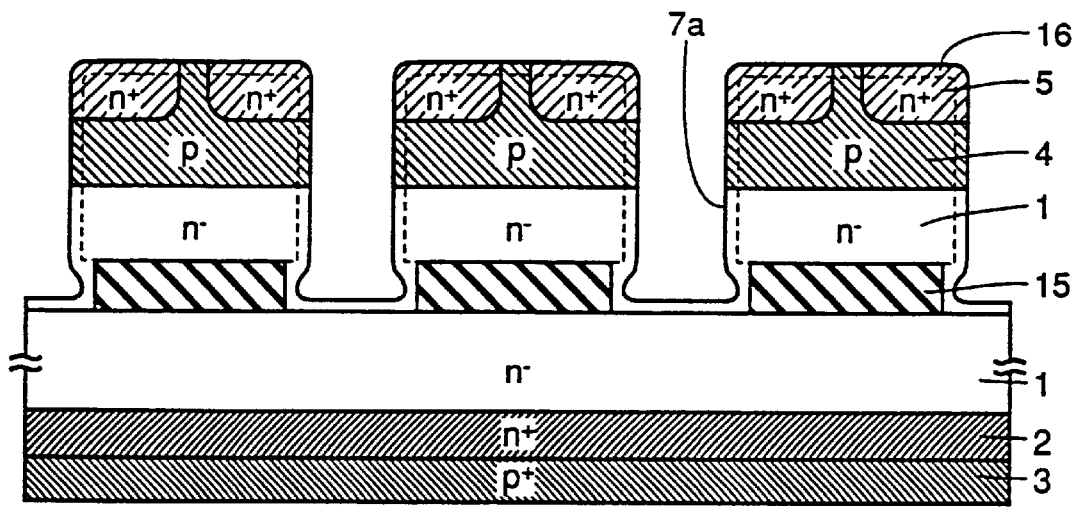

Referring to FIG. 14, a silicon film 16 having a thickness of dx and the same impurity concentration as n⁻ silicon substrate 1 is formed over inner surfaces of gate trench grooves 7a by an epitaxial growth method. In this step, as shown in FIG. 15, heat treatment during the epitaxial growth diffuses impurity in n⁺ emitter region 5 and p-well 4 into silicon layer 16.

Silicon film 16 formed by the epitaxial growth may be replaced with polycrystalline silicon which has a high resistance and is formed of same material as n⁻ silicon substrate 1.

Figure 16:
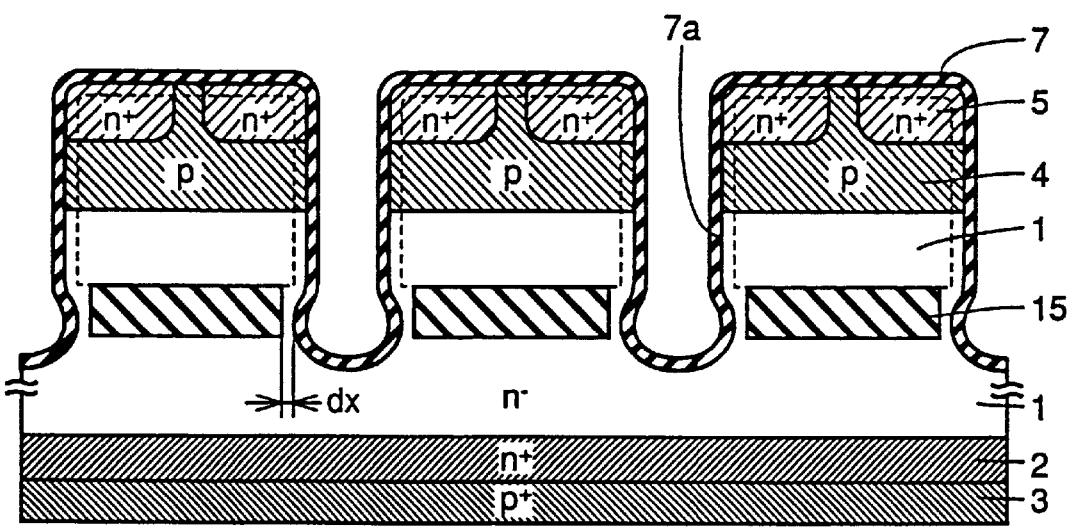

Referring to FIG. 16, gate insulating films 7 are formed in gate trench grooves 7a, for example, by heat oxidation. It is preferable to ensure such a relationship that the film thickness of insulating layer 15 is substantially smaller than a quadruple of that of gate insulating film 7, as already described.

Before forming gate insulating film 7 but after forming gate trench groove 7a, isotropic plasma etching and sacrifice oxide may be formed so that characteristics of the trench MOS and gate insulating film 7 can be improved. More specifically, if an opening and a bottom of gate trench groove 7a had sharp edges or corners, local reduction in thickness of gate oxide film 7 and concentration of electric field would occur. In contrast to this, round opening and bottom of gate trench groove 7a shown in FIG. 16 can suppress concentration of the electric field.

Figure 17:
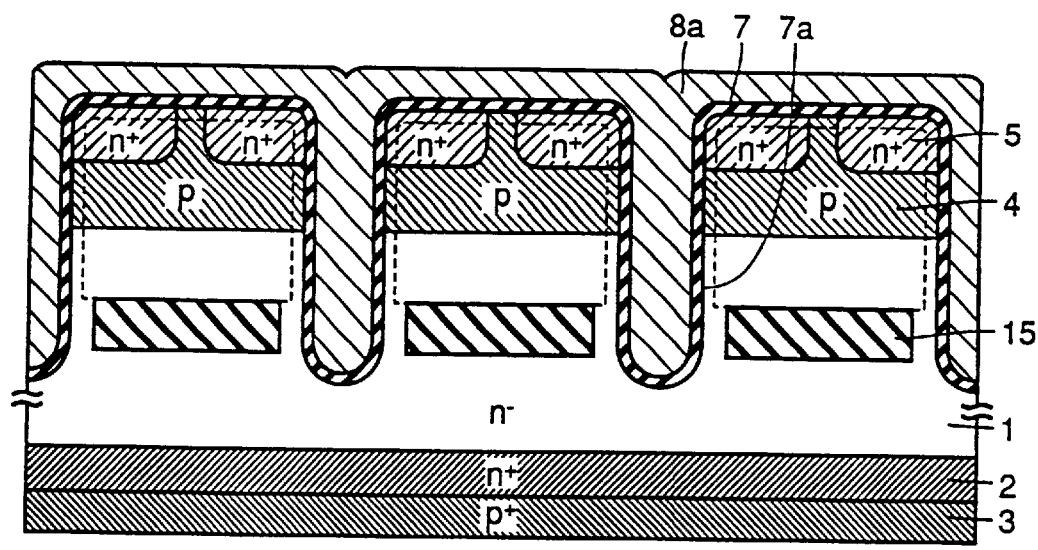
Figure 18:
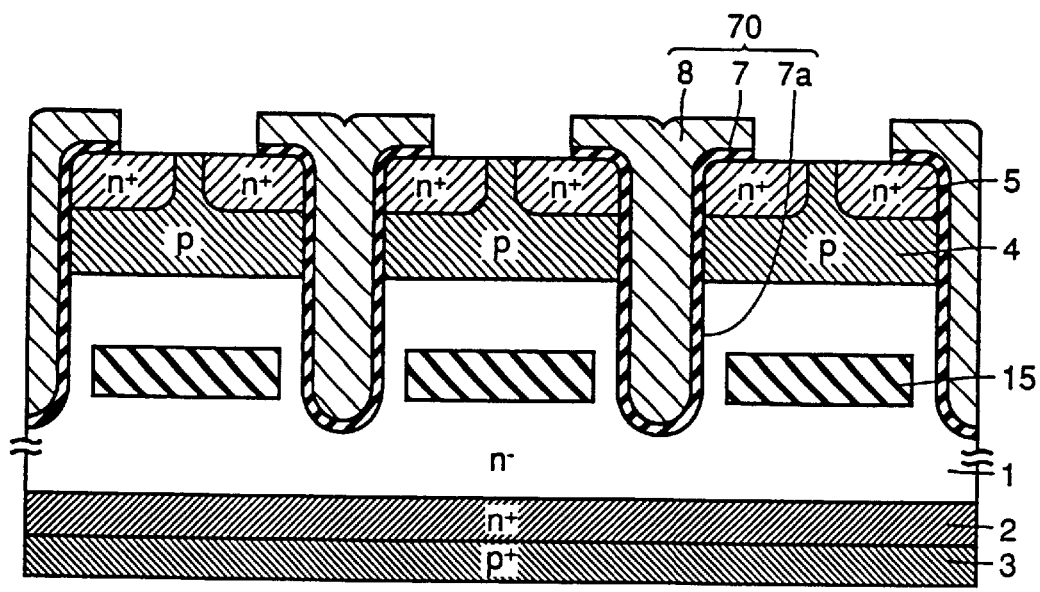

Referring to FIG. 17, gate trench grooves 7a are filled with a conductive material 8a such as doped n-type polycrystalline silicon by a CVD method or the like. Thereafter, conductive material 8a and gate insulating film 7 are patterned to expose n⁺ emitter regions 5 and p-wells 4 as shown in FIG. 18. In this manner, each trench gate 70 formed of gate trench groove 7a, gate insulating film 7 and gate electrode 8 is completed.

Figure 19:
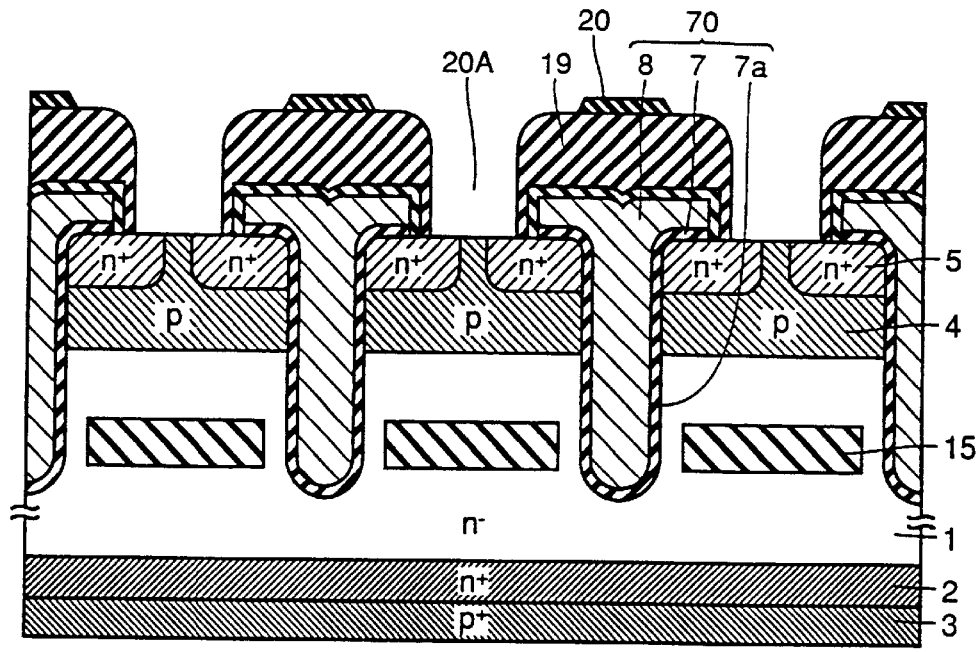

Referring to FIG. 19, a silicate glass (BPSG) film 19 and a CVD film 20, which contains boron and phosphorus having a good coating performance. Thereafter, silicate glass film 19 and CVD oxide film 20 are etched to form contact holes 20A each exposing expose n⁺ emitter region 5 and p-well 4.

Figure 20:
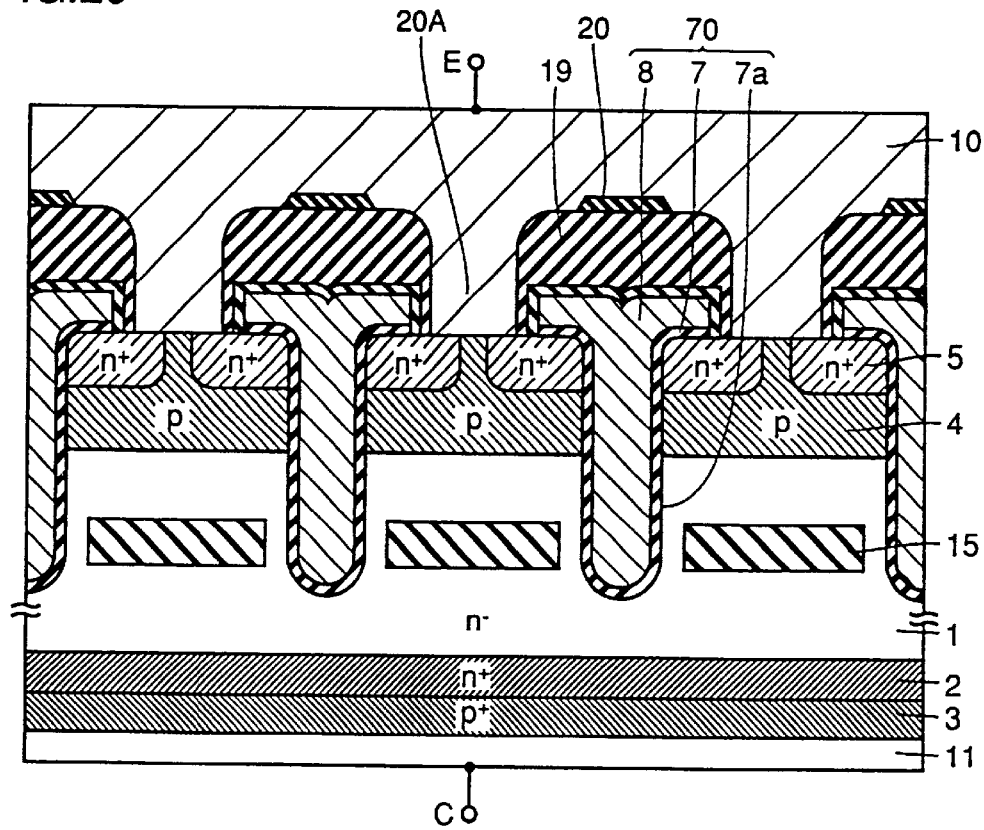

Referring to FIG. 20, after forming contact holes 20A, emitter electrode 10 electrically connected to n⁺ emitter regions 5 and p-wells 4 is formed on the whole surface above the first main surface of n⁻ silicon substrate 1.

Collector electrode 11 is formed on p-collector 3 over the second main surface of silicon substrate 1. In this manner, the IGBT according to the embodiment 1 shown in FIG. 1 is completed.

A second specific example of the IGBT according to the embodiment 1 will be described below with reference to FIGS. 21(a) to 29.

Figure 21A:
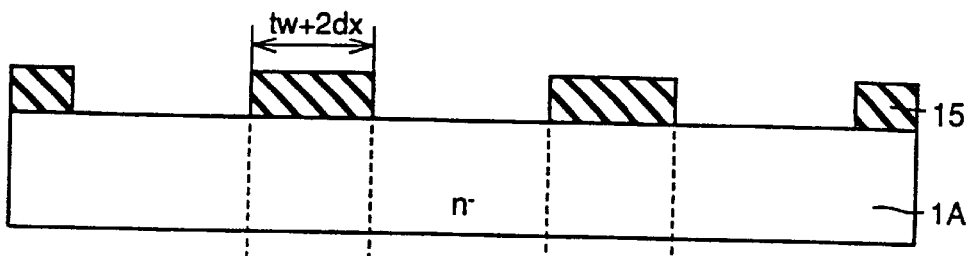
FIGS. 21(a) to 29 are cross sections showing 1st to 9th steps for manufacturing a high-breakdown-voltage IGBT of a gate trench type of a second form the embodiment 1 of the invention, respectively.
Figure 22A:
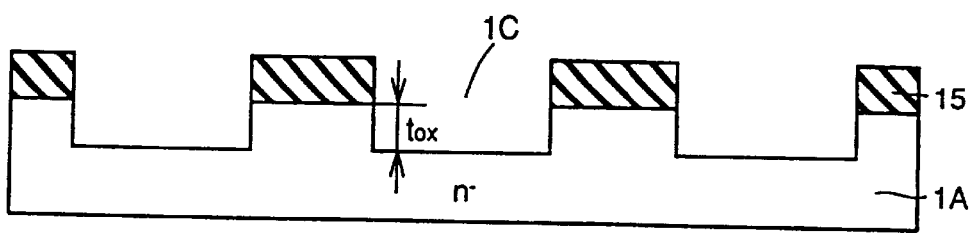

Referring to FIG. 21A, a pattern formed of insulating layers 15 each having a width of $t_w + 2dx$ is formed on an n⁻ silicon substrate 1A having an impurity concentration from 200 to 1000 Ω·cm. Using insulating layer 15, n⁻ silicon substrate 1A is patterned to form concavities 1C of $t_{ox}$ in depth, as shown in FIG. 22A.

Figure 21B:
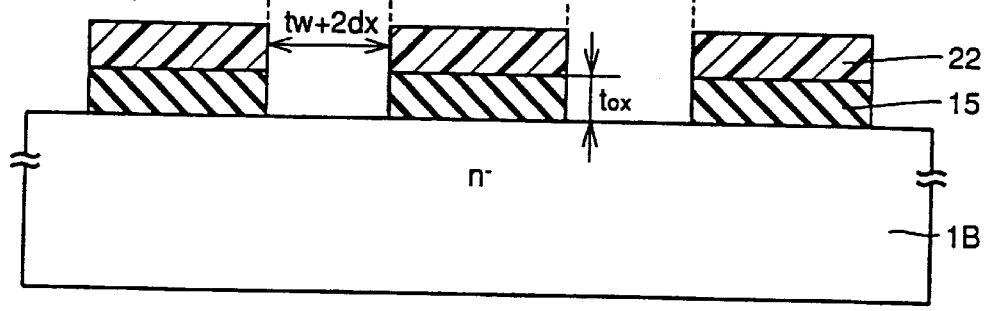
Figure 22B:
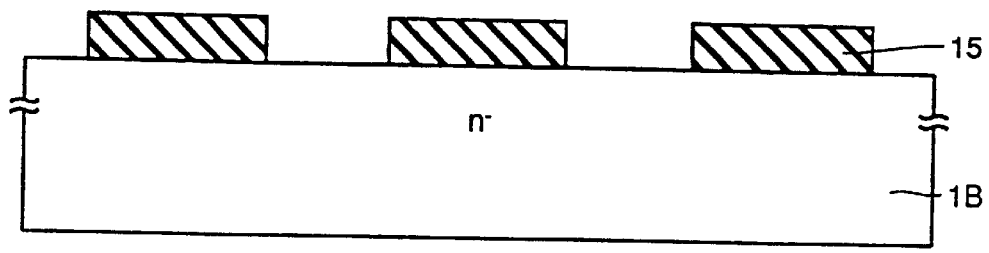

Referring to FIG. 21B, another insulating layer 15 made of, e.g., an oxide film and having a film thickness of $t_{ox}$ is deposited on an n⁻ silicon substrate 1B having the same impurity concentration as silicon substrate 1A. A resist film 22 of a pattern having an open width $t_w + 2dx$ is formed on insulating layer 15. Insulating layer 15 is patterned, and then resist film 22 is removed as shown in FIG. 22B.

Figure 23:
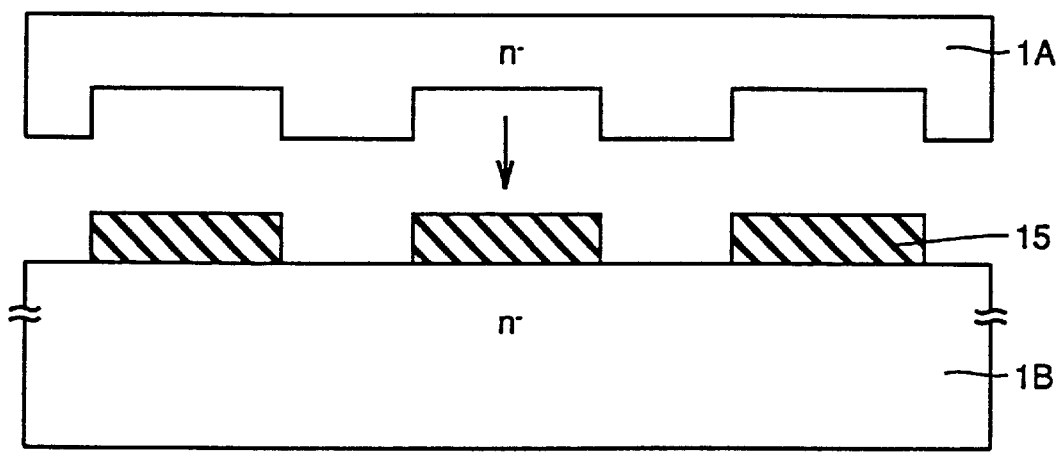

Referring to FIG. 23, n⁻ silicon substrates 1A and 1B are washed after removing insulating layer 15 on n⁻ silicon substrate 1A. n⁻ silicon substrates 1A and 1B are laminated together as shown in FIG. 23, and heat treatment is effected on them at a temperature from 850 to 1100° C. in an atmosphere of $O_2$.

Figure 24:
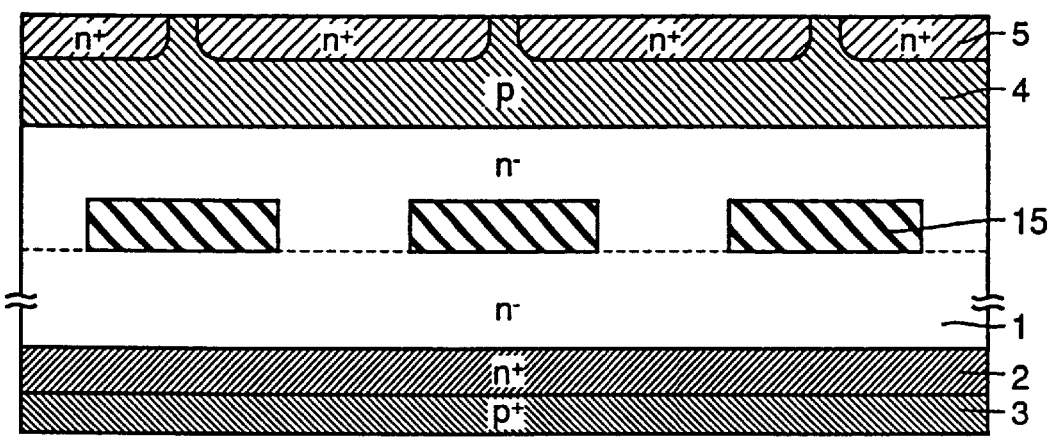

Referring to FIG. 24, the same step as that of the specific example 1 shown in FIG. 11 is executed to form p-well 4, n⁺ emitter regions 5, n-buffer layer 2 and p-collector layer 3. n-buffer layer 2 and p-collector layer 3 may be formed in advance at n⁻ silicon substrate 1B.

Although p-collector layer 3 is formed on a whole area of the second main surface of n⁻ silicon substrate 1, n-type diffusion layer or lightly doped p-diffusion layer may be locally arranged, so that a performance of the IGBT can be improved.

Figure 25:
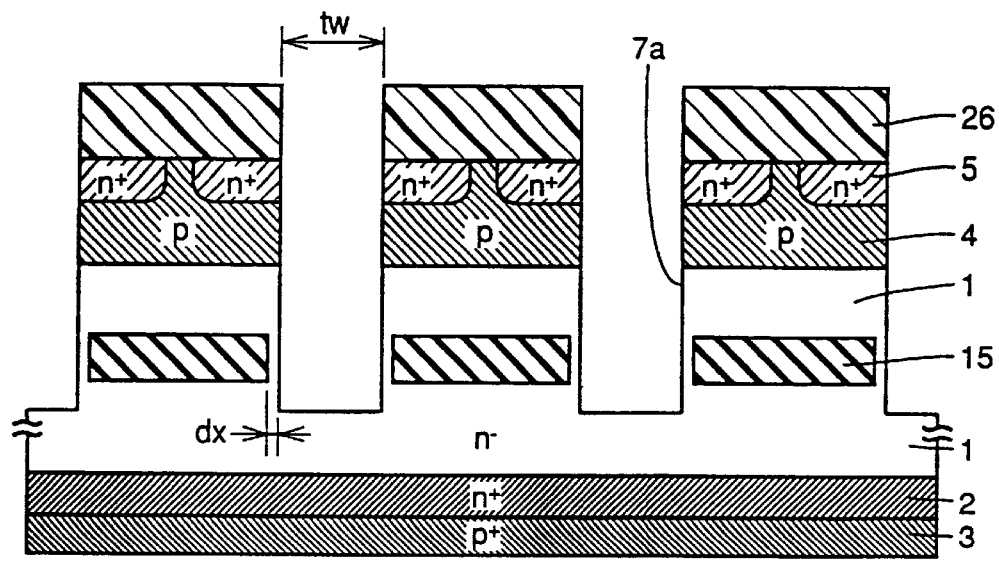

Referring to FIG. 25, a CVD oxide film 26 and having an appropriate opening pattern is formed on p-well 4. Using oxide film 26 as a mask, gate trench grooves 7a extending between insulating layers 15 are formed. In this example of the embodiment, gate trench groove 7a has a width ($t_w$) from about 0.8 to about 3.0 μm and a depth from about 3.0 to about 15.0 μm. Here, the depth of gate trench groove 7a is a parameter depending on the thickness of insulating layer 15. A distance between gate trench groove 7a and insulating layer 15 is defined as dx.

Figure 26:
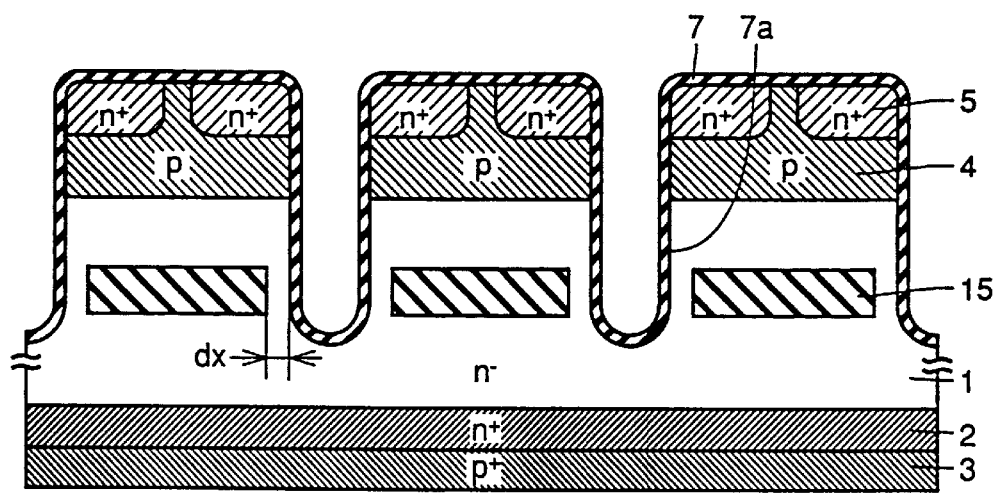

Referring to FIG. 26, gate insulating film 7 is formed on inner surfaces of gate trench grooves 7a. Similarly to the practical example 1 already described, a sacrifice oxide film is formed and processing such as isotropic plasma etching and sacrificial oxidation or the like is executed before forming gate insulating film 7 but after forming gate trench grooves 7a, so that the opening and bottom of each gate trench groove 7a are rounded, and irregular side wall of gate trench groove 7a is smoothed. Therefore, properties of the trench MOS and gate insulating film 7 can be improved.

Figure 27:
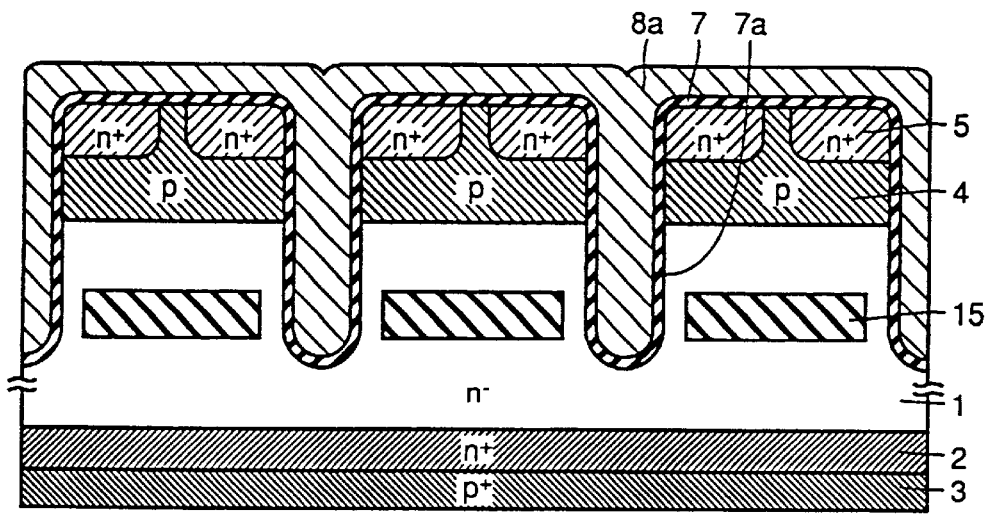
Figure 28:
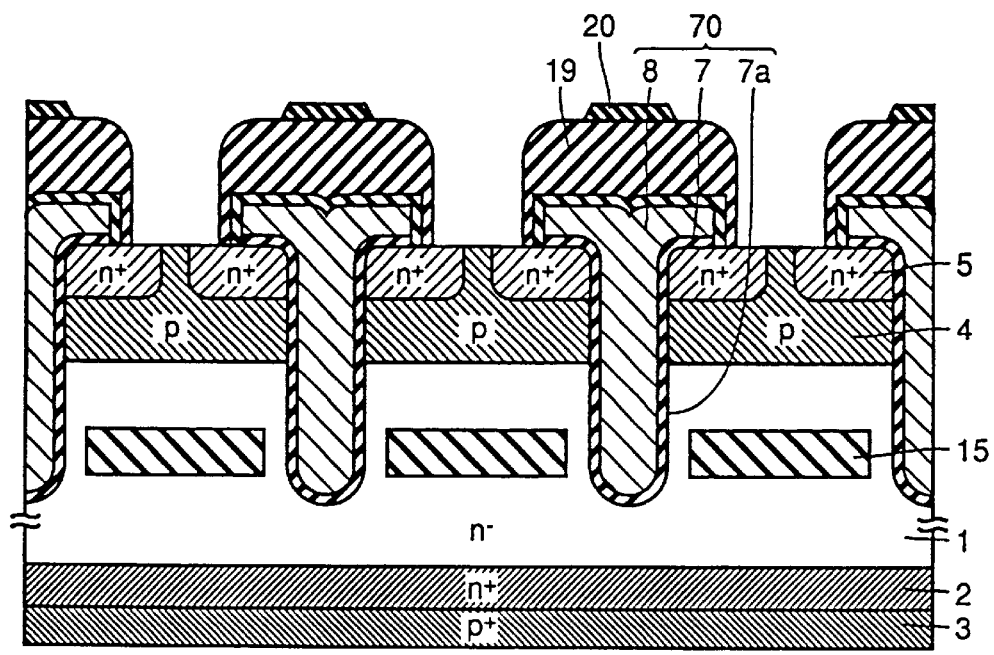

Referring to FIG. 27, a conductive material 8a made of, e.g., doped n-type polycrystalline silicon is deposited in gate trench groove 7a. Thereafter, as shown in FIG. 28, conductive material 8a and gate insulating film 7 are patterned into predetermined configurations, so that gate electrode 8 is completed and thus trench gate 70 formed of gate trench groove 7a, gate insulating film 7 and gate electrode 8 is completed. Thereafter, silicate glass film 19 covering only gate trench 70 as well as CVD oxide film 20 are formed, and contact hole 20A is formed.

Figure 29:
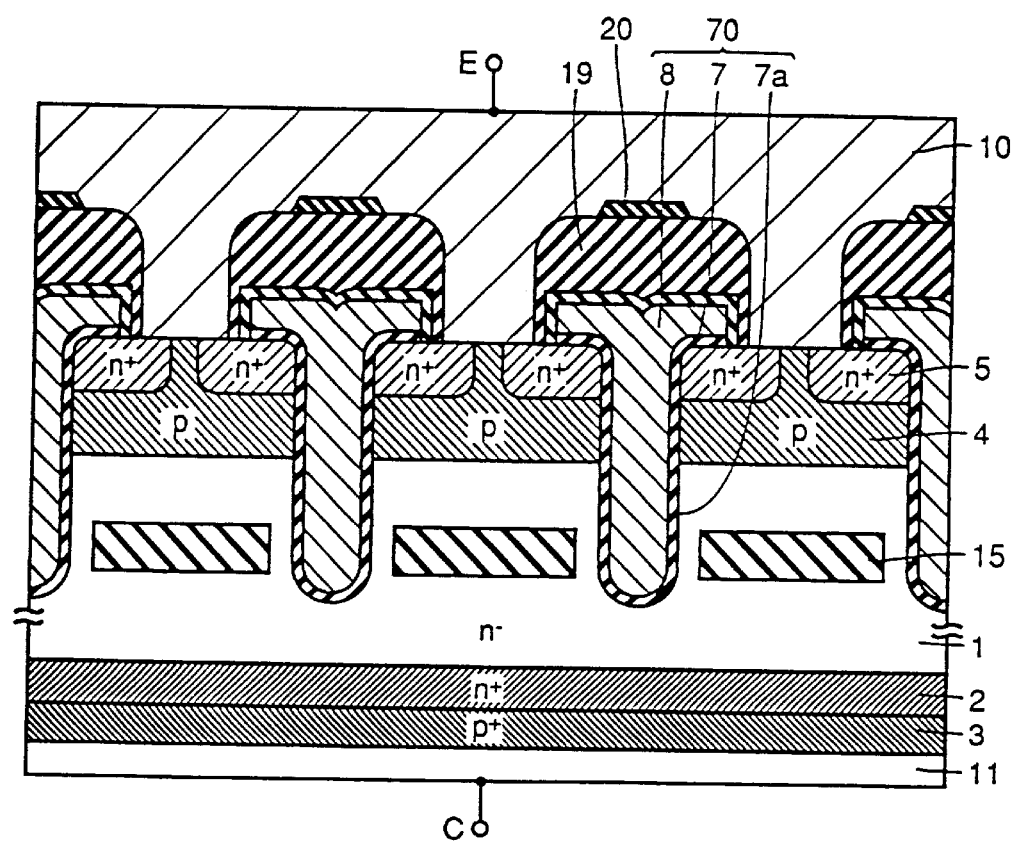

Referring to FIG. 29, emitter electrode 10 which is electrically connected to n⁺ emitter region 5 and p-well 4 is formed on the first main surface of n⁻ silicon substrate 1, and collector electrode 11 is formed on the surface of p-collector layer 3 formed over the second main surface of n⁻ silicon substrate 1. In these manners of the second practical example, the IGBT shown in FIG. 1 can be fabricated.

In the IGBT of the embodiment 1, insulating layer 15 functions as a kind of capacitor during the off state. Electrons are attracted onto the upper surface of insulating layer 15, so that strongly negative space charges are formed. An electric field, which is gradually increased by donor ions coming from a lower side of n⁻ silicon substrate 1 and tends to be applied to p-well 4, is intercepted by the above strongly negative space charges, so that an electric field is not substantially present between insulating layer 15 and p-well 4. Thereby, the potential at the upper surface of insulating layer 15 lowers to a potential nearly equal to the potential at and under emitter region 5 connected to p-well 4.

The potential at the lower surface of insulating layer 15 rises to an extent corresponding to the voltage drop in insulating layer 15, and this potential rise is proportional to the thickness of insulating layer 15. Therefore, this potential rise can be suppressed to allow only a slight rise by reducing the thickness of insulating layer 15. Meanwhile, a potential not higher than the emitter potential is set in gate trench 70, and the electric field is enhanced at the corner of the bottom of gate trench 70. However, if the end of insulating layer 15 is close to the bottom corner of the trench, a potential difference between them is small, because a lower potential is carried under insulating layer 15. Thereby, the electric field is reduced, so that the breakdown voltage can be improved.

As described above, in order to reduce a difference between the potential under insulating layer 15 and the potential at gate trench 70, thinner insulating layer 15 is advantageous in view of the breakdown voltage. According to the evaluation results, it can be considered that the optimum thickness of insulating layer 15 is substantially smaller than a quadruple of the thickness of gate insulating film 7 of gate trench 70.

Optimum distance dx between the wall surface of gate trench 70 and insulating layer 15 is substantially equal to the thickness of insulating layer 15. If distance dx is excessively small, the breakdown voltage decreases. It is desirable that the depth of insulating layer 15 is substantially equal to the depth of gate trench 70 from the viewpoint of the breakdown voltage.

During the on state of the IGBT, the insulating layer 15 functions to prevent attraction of holes into p-well 4. Since gate trench 70 is biased strongly positively, electrons are attracted onto the wall of gate trench 70, and holes are repelled. Therefore, holes cannot easily move through a gap (dx) between the wall of gate trench 70 and insulating layer 15, and thus cannot easily arrive at p-well 4.

For the above reason, the hole loss at the emitter side decreases, and an efficiency of introduction of electrons from the trench channel increases, so that a large amount of electrons and holes are supplied into $n^-$ silicon substrate 1, which improves the electric conductance and reduces the saturation voltage. Therefore, in order to decrease the saturation voltage in this manner, it is necessary to narrow a gap between the wall of gate trench 70 and insulating layer 15, and for this purpose, insulating layer 15 must be shallower than the gate trench 70.

As the pitch of gate trench 70 increases, a ratio of dx to the pitch decreases, and holes are suppressed from reaching p-well 4 to a further extent, so that the carrier density increases. However, if the pitch were excessively large, holes would disappear due to recombination between them, resulting in reduction of the carrier density.

As described above, when the density of carriers in $n^-$ silicon substrate 1 increases at the emitter side during the on state of the IGBT, the conductivity of $n^-$ silicon substrate 1 increases, and the saturation voltage lowers. In this case, when the supply of holes from p-collector 3 is reduced to restore the saturation voltage, such a distribution is established that the carrier density at the emitter electrode side is higher than that at the collector electrode side as shown in FIG. 8.

Operation during the turn-off of the IGBT will now be discussed below. In general, when the channel can supply sufficient electrons no longer due to lowering of the gate voltage, and thereby the collector voltage starts to rise, excessive holes stored in $n^-$ silicon substrate 1 are attracted toward gate trench 70 carrying a lower voltage. As a result, holes move along the wall of gate trench 70 to p-well 4.

Accordingly, a large current would not flow through a portion under p-well 4 surrounded by gate trenches 70 during the turn-off state even if insulating layer 15 were not present at this portion, so that existence of insulating layer 15 at this portion does not cause a particular problem.

Figure 8:
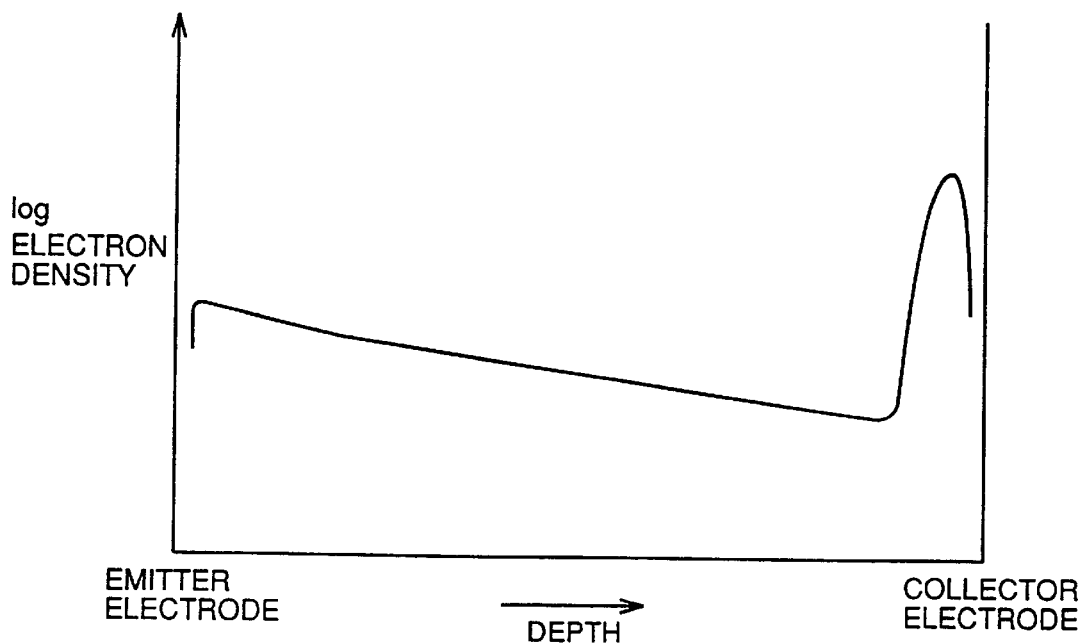
FIG. 8 shows a vertical distribution of electron density in the embodiment 1 of the invention.

When the IGBT which has the carrier distribution shown in FIG. 8 during the on state is turned off, many holes which existed at the emitter electrode side are discharged from the emitter electrode side, so that the depletion layer formed by discharging holes extends only slowly at an initial stage during the turn-off, and the collector voltage starts to rise relatively slowly.

When the collector voltage rises to a certain extent and the depletion layer extends, the end of the depletion layer reaches a region containing only a small amount of carriers which were initially accumulated, so that extension of the depletion layer owing to discharge of holes occurs rapidly.

Similarly to the IGBT of the conventional structure, the electric field in the depletion layer is enhanced by modulation with a difference between charge densities of electrons and holes forming the current, and impact-generated carriers temporarily supply an electron current to delay the turn-off. In this case, however, the difference in density between holes and electrons is slightly small, so that the above delay occurs only to a small extent.

As a result, the collector voltage continues rapid rising until the end of turn-off. As shown in FIG. 7, therefore, the turn-off loss is reduced, and it is possible to suppress rise in temperature inside the IGBT due to the turn-off loss.

In FIG. 7, the gate trench pitch is four times as large as the reference pitch, so that the gate capacity is reduced to a quarter correspondingly to reduction in gate trench number per area. Although the gate drive resistance which is used for evaluating the turn-off operation is increased fourfold as compared with the reference IGBT, the example in FIG. 7 can perform turn-off slightly but more rapidly, so that it can achieve an effect of reducing the gate capacity.

Further, this embodiment can employ the gate trench grooves with an increased pitch, and thereby can improve the performance.

In this embodiment, the thin insulating layer is located near the bottom corner of the gate trench to keep a low potential above the insulating layer, which is an important point for improving the performance, as can be understood from the above description. This condition can be achieve by structures other than the insulating layer buried in a planar fashion, and embodiments 2 and 3 which will be described below can be employed as practical application.

(Embodiment 2)

A semiconductor device with a high breakdown voltage and a method of manufacturing the same according to the embodiment 2 of the invention will be described below.

Figure 30:
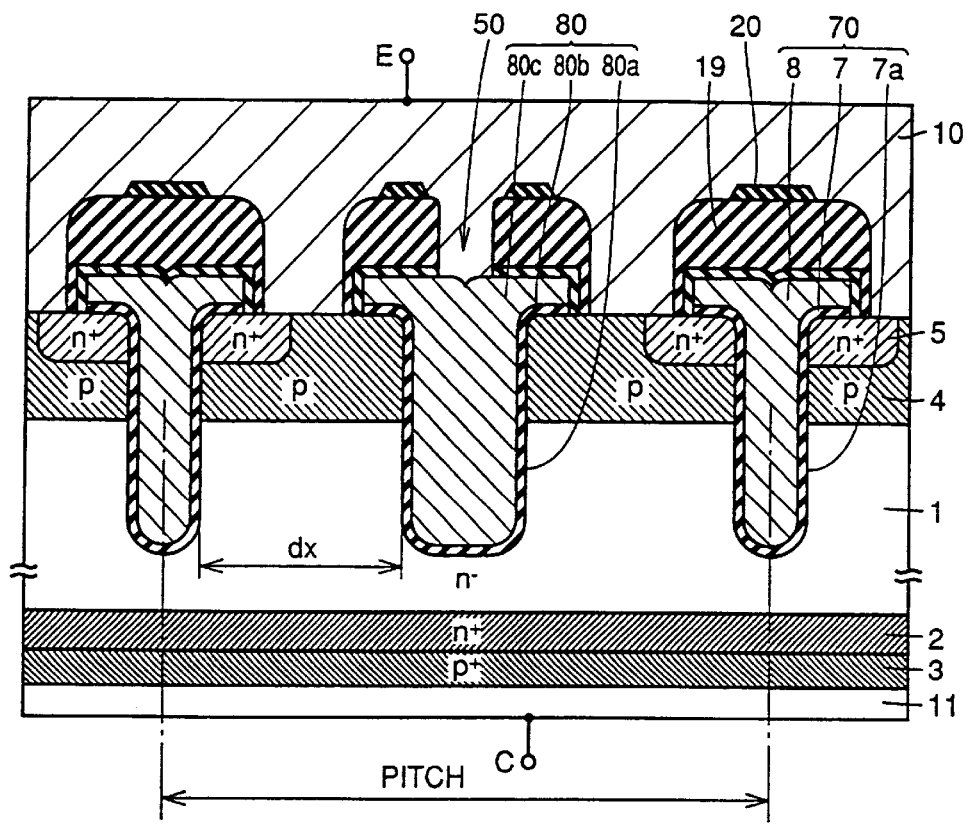
FIG. 30 is a cross section showing a structure of the high-breakdown-voltage IGBT of the gate trench type of an embodiment 2 of the invention.

Referring to FIG. 30, a sectional structure of a high-breakdown-voltage IGBT of a gate trench type will be described below as an example of a semiconductor device with a high breakdown voltage of the embodiment 2. Portions and parts bearing the same reference numbers as those of the embodiment 1 have the same functions.

In addition to the structure of IGBT of the embodiment 1, the structure of IGBT of the embodiment 2 includes an emitter trench 80 between gate trenches 70.

Emitter trench 80 has an emitter trench groove 80a having the same depth as gate trench groove 7a of gate trench 70, an emitter insulating film 80 covering an inner surface of emitter trench groove 80a, and an emitter trench electrode 80c filling emitter trench groove 80a and made of doped polycrystalline silicon. Emitter trench electrode 80c is electrically connected to emitter electrode 10.

Figure 31:
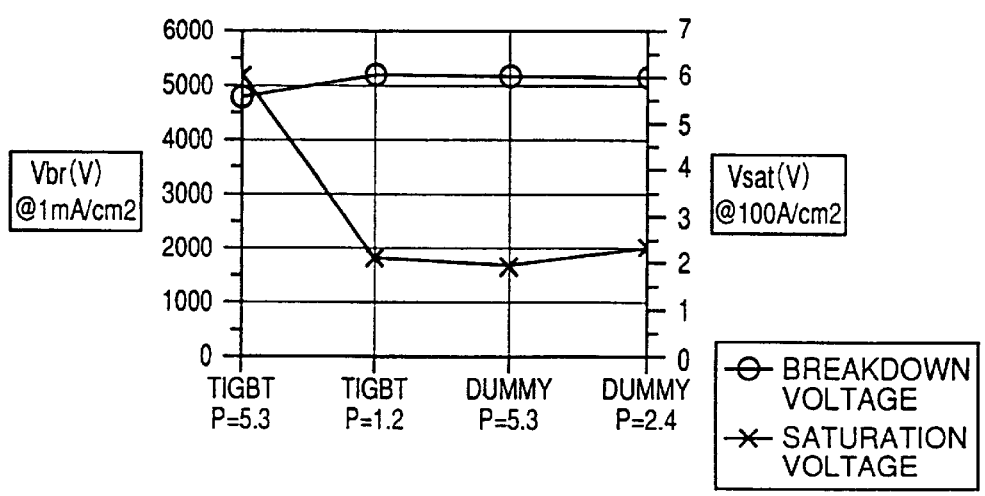
FIG. 31 shows dependency of a breakdown voltage and a saturation voltage on gate trench pitch specifications of the IGBT of the embodiment 2 of the invention and the conventional IGBT.

One prepared IGBTs which employed the above structure, and each had distance dx of 0.2 μm between gate trench 70 and emitter trench 80. In the IGBTs, the pitch of gate trenches 70 were set to a reference value of 5.2 μm and 2.4 μm, respectively. The saturation voltages and breakdown voltages of these IGBTs were compared with those of the conventional structure. Results are shown in FIG. 31. (In the graph, "Dummy" corresponds to the values for the present structure. The standard TIGBT having a pitch of 5.3 μm corresponds to the structure having dx of 4.3 μm.)

As compared with the standard IGBT, each of the structures having dx of 0.2 μm had a reduced saturation voltage and an increased quantity of carriers introduced into silicon substrate 1. It can also be seen that the breakdown voltage slightly increased and therefore the IGBT had an improved performance.

A method of manufacturing the IGBT of the embodiment 2 thus constructed will be described below with reference to FIGS. 32 to 40. FIGS. 32 to 40 are cross sections corresponding to that of FIG. 30, and show manufacturing steps, respectively.

Figure 32:
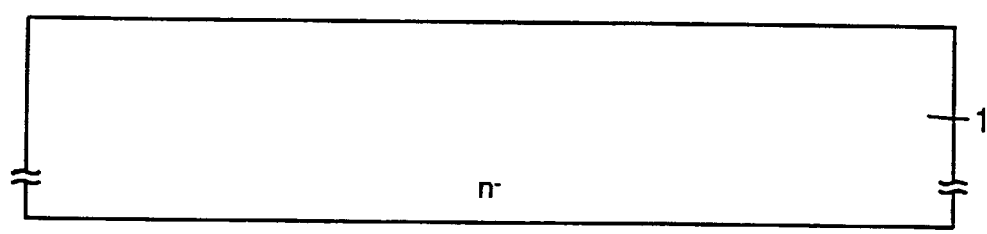
FIGS. 32 to 40 are cross sections showing 1st to 9th steps for manufacturing the high-breakdown-voltage IGBT of a gate trench type according to the embodiment 2 of the invention, respectively.

Referring to FIG. 32, a step is performed to prepare n⁻ silicon substrate 1 having an impurity concentration from 200 to 1000 Ω·cm.

Figure 33:
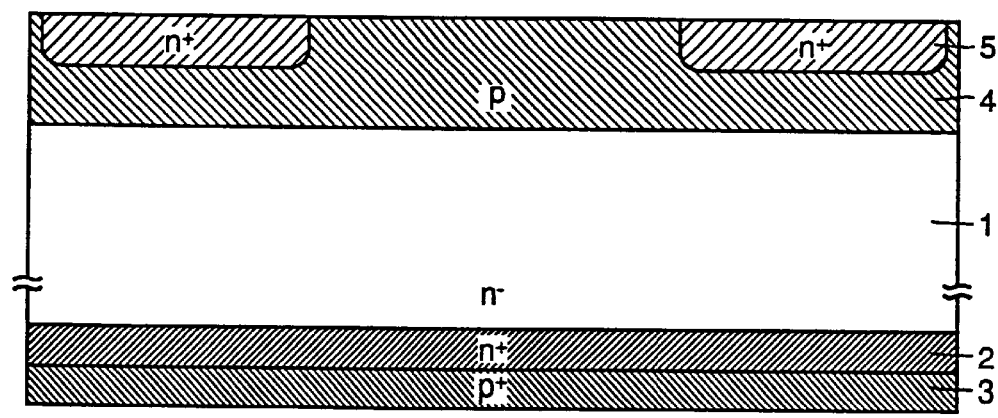

Referring to FIG. 33, processing similar to that of the embodiment 1 is performed to form p-well 4 and n⁺ emitter regions 5 at and near the first main surface of n⁻ silicon substrate 1. p-well 4 has a depth from 1.5 to 4.0 μm, and an impurity peak concentration from $1 \times 10^{15}$ to $5 \times 10^{18}$ cm$^{-3}$. n⁺ emitter regions 5 have a depth from 0.8 to 2.0 μm and a surface impurity concentration from $1 \times 10^{19}$ to $1 \times 10^{20}$ cm$^{-3}$.

n-buffer layer 2, which has a depth from 10 to 30 μm and a peak concentration from $1 \times 10^{14}$ to $1 \times 10^{18}$ cm$^{-3}$, and p-collector layer 3, which has a depth from 3 to 10 μm, and an impurity peak concentration higher than that of n-buffer layer 2, are formed at and near the second main surface of n⁻ silicon substrate 1.

Figure 34:
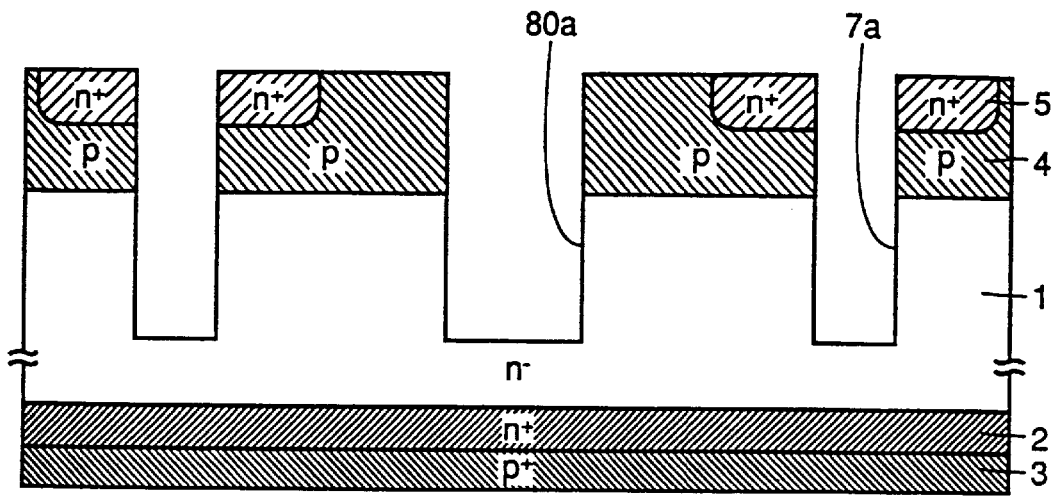
Figure 35:
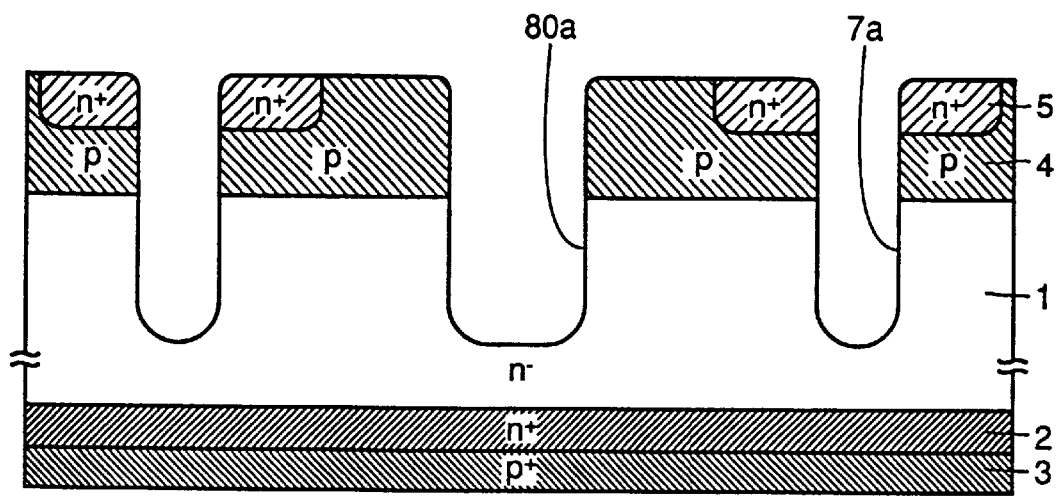

Referring to FIG. 34, processing is performed to form gate trench grooves 7a extending through n⁺ emitter regions 5 and emitter trench groove 80a located between n⁺ emitter regions 5. Referring to FIG. 35, processing such as isotropic plasma etching and formation of a sacrifice oxidation film is performed after forming gate trench grooves 7a and emitter trench groove 80a, so that the openings and bottoms of gate trench grooves 7a as well as the opening and bottom of emitter trench groove 80a are rounded, and irregular surfaces of the side walls of gate trench grooves 7a and emitter trench groove 80a are smoothed. Consequently, it is possible to improve characteristics of the insulating films formed at the inner surfaces of gate trench grooves 7a and emitter trench groove 80a.

Figure 36:
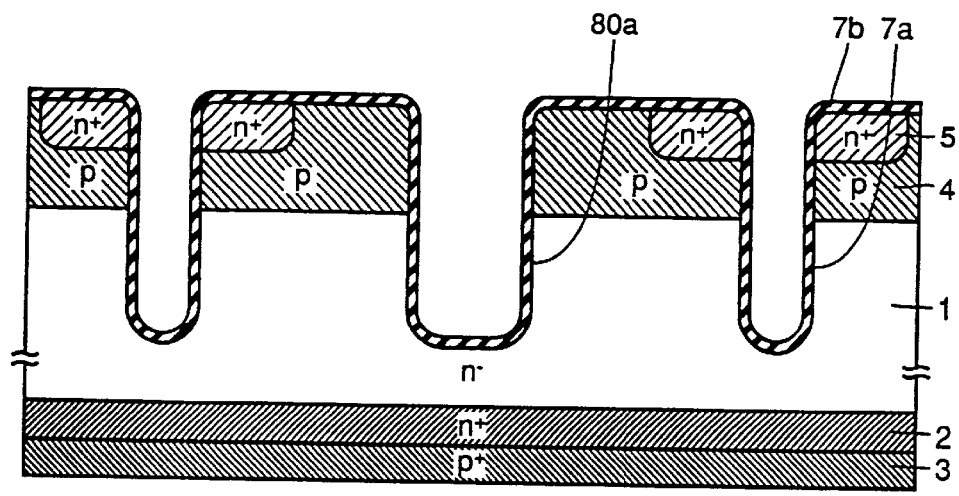

Referring to FIG. 36, an insulating film 7b, which is made of SiO₂ or the like and will form gate insulating films 7 and emitter insulating film 80b, is formed in gate trench grooves 7a and emitter trench groove 80a.

Figure 37:
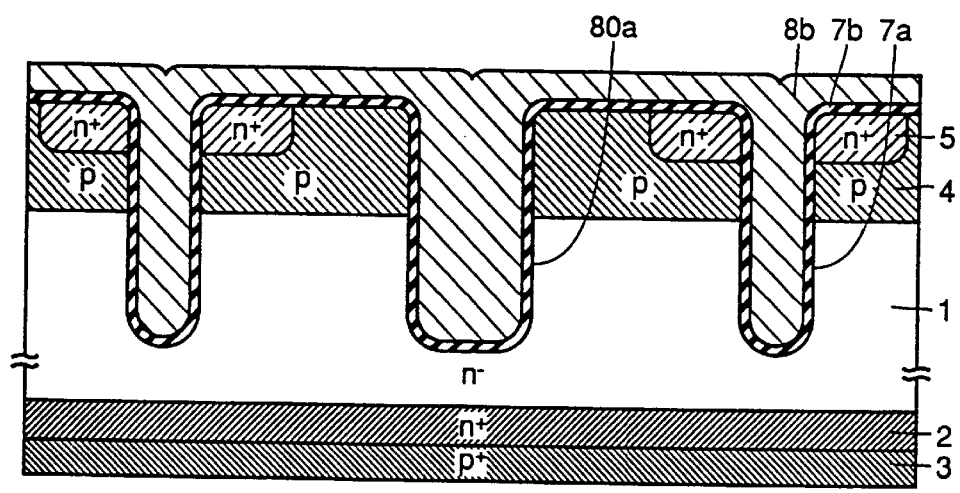

Referring to FIG. 37, a step is performed to fill gate trench grooves 7a and emitter trench groove 80a with a conductive material 8b made of doped n-type polycrystalline silicon.

Figure 38:
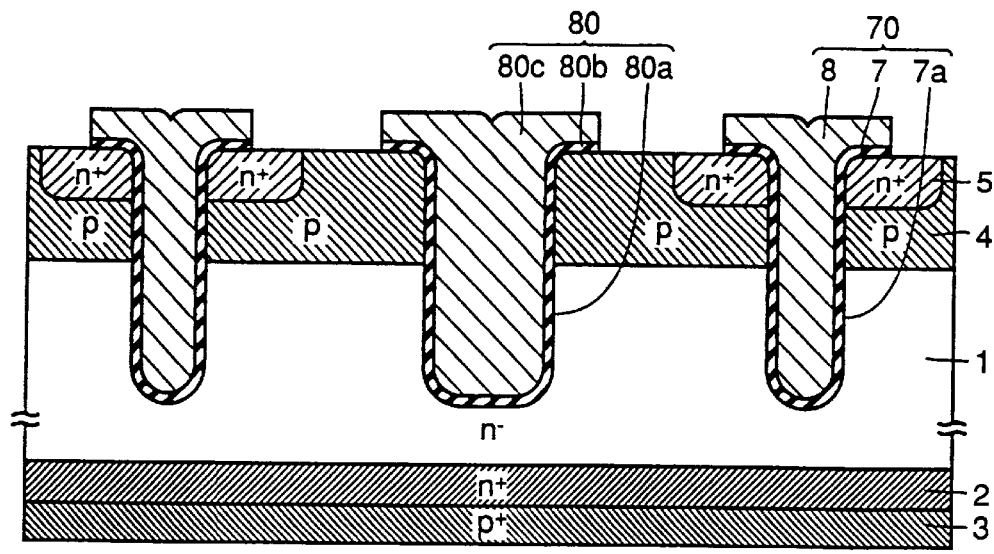

Referring to FIG. 38, insulating film 7b and conductive material 8b are patterned into predetermined configurations to form gate trenches 70, each of which is formed of gate trench groove 7a, gate insulating film 7 and gate electrode 8, and emitter trench 80, which is formed of emitter trench groove 80a, emitter insulating film 80b and emitter trench electrode 80c.

Figure 39:
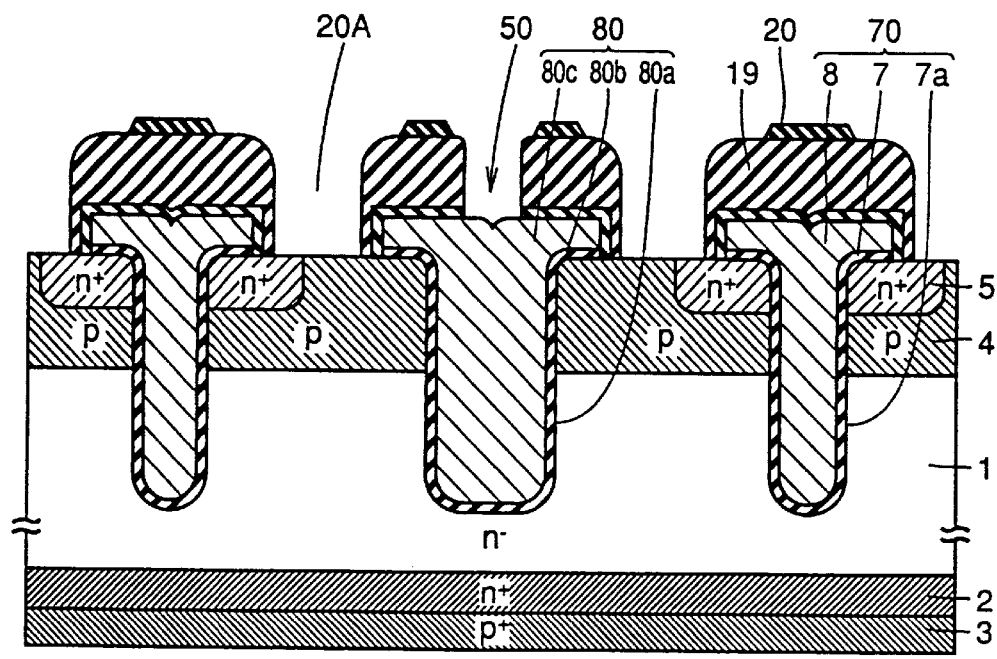
Figure 41:
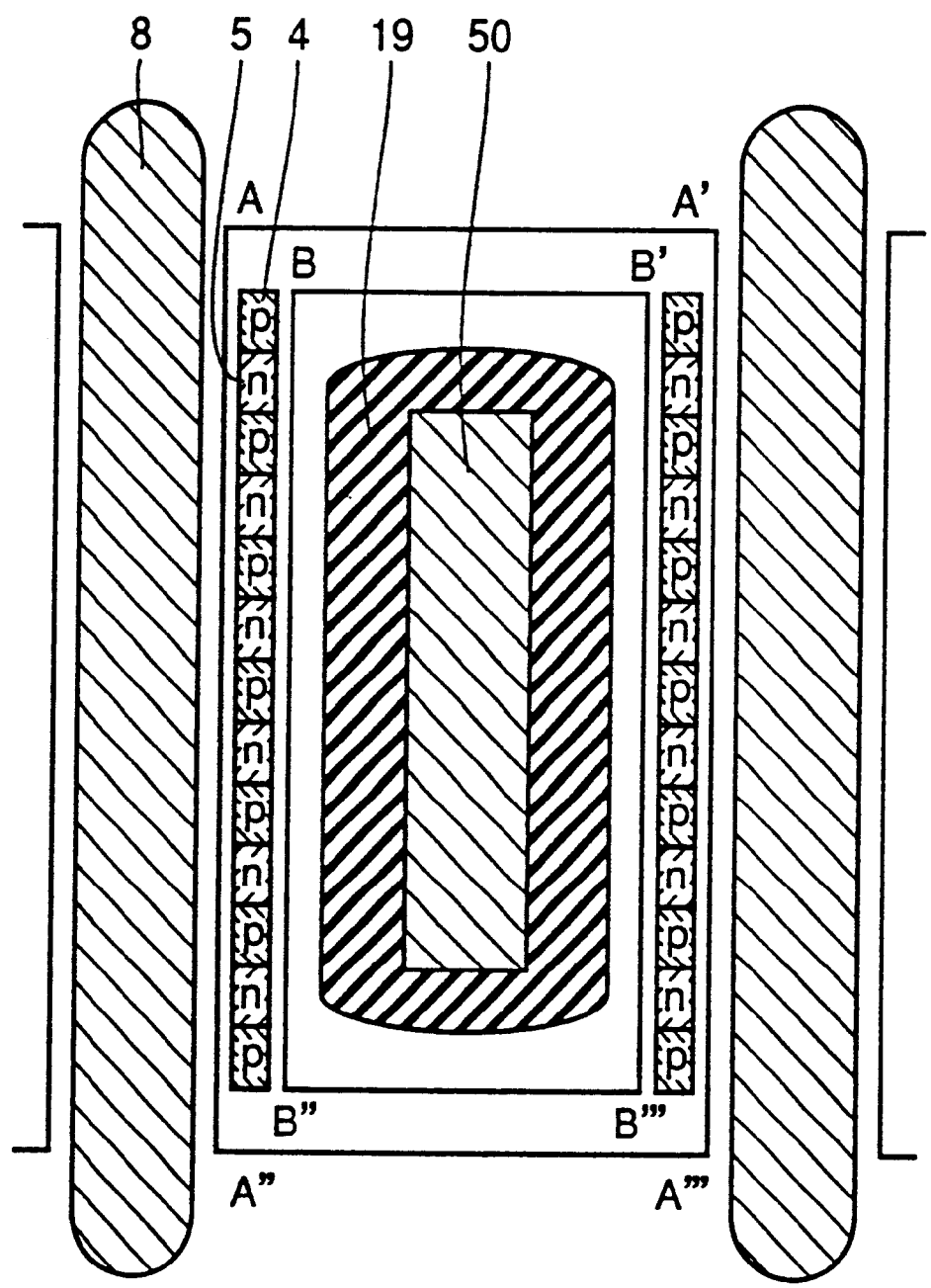
FIG. 41 is a top view showing the pattern corresponding to FIG. 39, according to the embodiment 2 of the invention.

Referring next to FIG. 39, a silicate glass mark 19 and a CVD oxide film 20 are formed, and contact holes 20A and 50 are opened. FIG. 41 is a top view showing the pattern of the structure at this time. Contact hole 20 is formed in the region surrounded by lines A–A'" and B–B'". In addition, n type doped polycrystalline silicon 8b is etched between lines A–A'" and B–B'", n type doped polycrystalline silicon 80c and 8 being electrically separated from one another.

Figure 40:
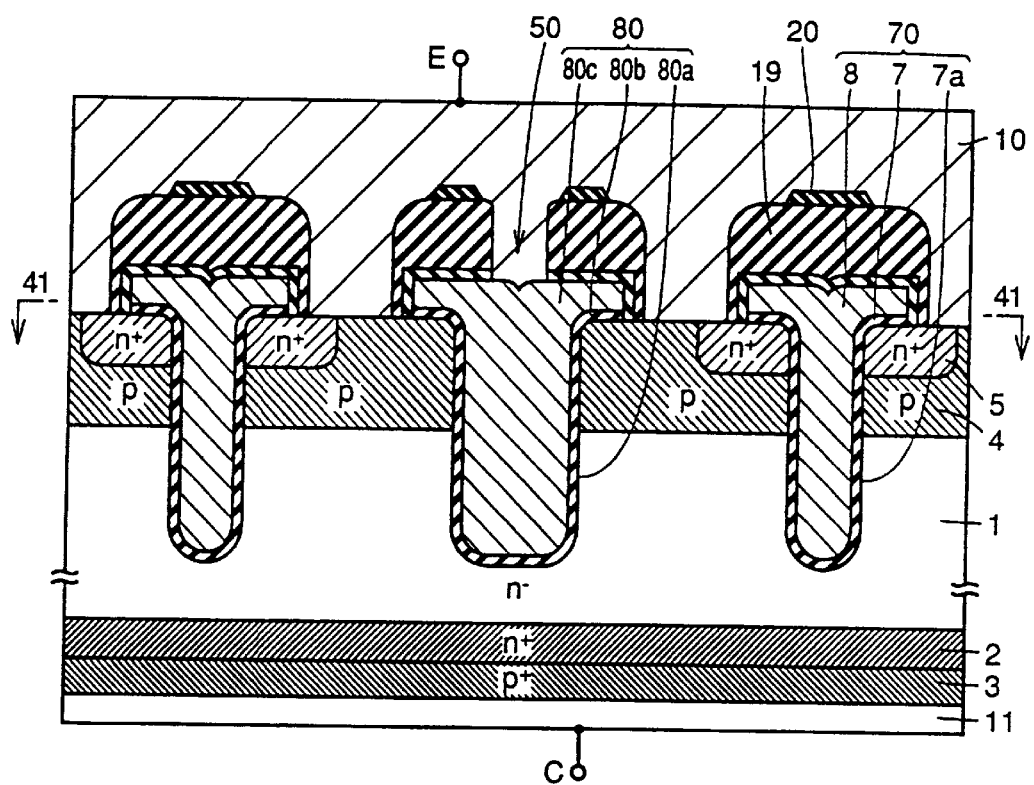

As shown in FIG. 40, processing such as sputtering is performed to form emitter electrode 10, which is located above the first main surface of n⁻ silicon substrate 1 and is electrically connected to n⁺ emitter region 5, p-well 4 and emitter trench electrode 80c. Processing such as sputtering is also performed to form collector electrode 11 at the surface of p-collector layer 3 over the second main surface of silicon substrate 1. In this manner, the IGBT of the embodiment 2 shown in FIG. 30 is completed.

If the structure of IGBT of the embodiment 2 is miniaturized to a higher extent, dx decreases and, in the same sectional plane, p-well 4 and n⁺ emitter region 5 cannot contact with emitter electrode 10 in some cases, as can be seen from the structural section in FIG. 30.

In these cases, p-wells 4 and n⁺ emitter regions 5 are alternately arranged as shown in a plan of FIG. 41, whereby the IGBT can actually have a miniaturized structure. The structure shown in FIG. 41 is taken along line 41—41 in FIG. 40.

As described above, the IGBT of the embodiment 2 can achieve the operation and effect similar to those of the IGBT of the embodiment 1, and further can ensure a high carrier introduction performance and an intended breakdown voltage merely by reducing dx without requiring all the gate trenches to be set to the gate potential.

It may seem that even a conventional structure can achieve an effect similar to that of the structure of the embodiment 2 by reducing the pitch and dx. However, according to the above embodiment, employment of the emitter trench reduces an area of gate trenches per unit area, so that the gate capacity can be reduced significantly. In particular, reduction in capacity (feedback capacity) between the gate and the collector allows rapid switching, so that the switching loss can be reduced. This effect can be achieved not only by this embodiment but also but the embodiment 1 already described and the embodiment 3 to be described later.

In semiconductor devices with high breakdown voltages which are employed for handling a high power, reduction in the gate capacity has been strongly demanded for simplifying the system. In view of this, the effect of this embodiment is practically very advantageous. The emitter trench structure allows formation of different kinds of trenches, i.e., gate trench and emitter trench only by changing a manner of connection to electrodes buried in the trenches. Therefore, the structure of this embodiment can be manufactured more easily than the structure of the embodiment 1.

(Embodiment 3)

A semiconductor device with a high breakdown voltage according to the embodiment 3 of the invention and a method of manufacturing the same will be described below.

Figure 42:
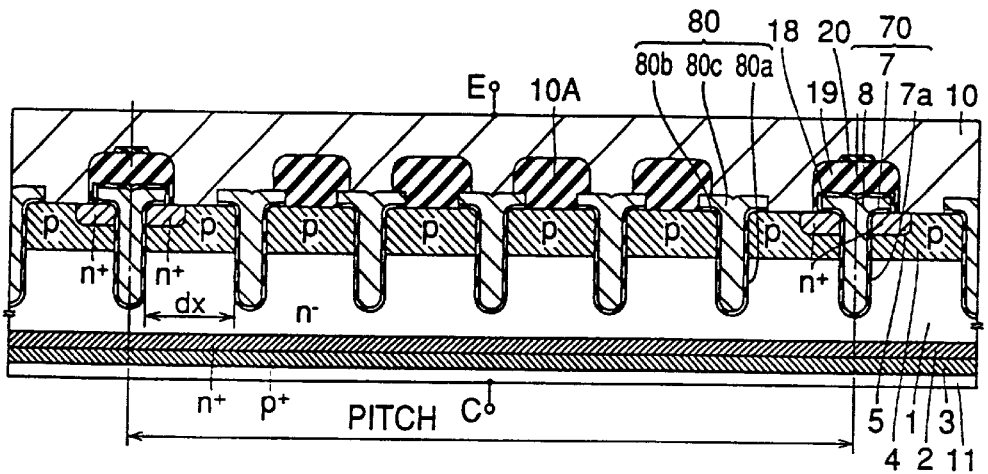
FIG. 42 is a cross section showing a high-breakdown-voltage IGBT of a gate trench type according to an embodiment 3 of the invention.

Referring first to FIG. 42, a sectional structure of an IGBT will be described below as an example of the semiconductor device with the high breakdown voltage according to the embodiment 3. In FIG. 42, parts and portions having the same functions as those of the embodiment 2 bear the same reference numbers. In FIG. 42, p-wells 4 arranged between emitter trenches 80 do not affect the operation of IGBT, and therefore are not essential, so that n⁻ silicon substrate 1 without these p-wells 4 may be employed.

In contrast to the IGBT of the embodiment 2 in which one emitter trench 80 is arranged between adjacent two gate trenches 70, the IGBT of the embodiment 3 has such a structure that a plurality of emitter trenches 80 adjacent to each other are arranged between two gate trenches 70 located at predetermined positions.

In this case, a ratio of distance dx between gate trench 70 and emitter trench 80 to the pitch of gate trenches 70 can be reduced to an intended value, even if gate trench 70 and emitter trench 80 have the same configurations. Therefore, this structure can be manufactured more easily than the structure of the embodiment 2.

Figure 50:
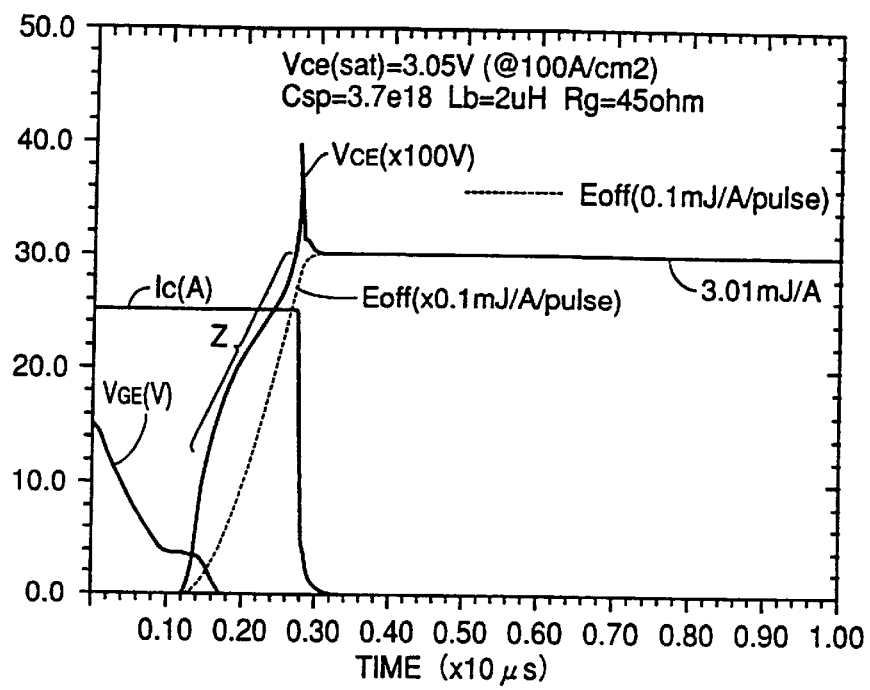
FIG. 50 shows inductive load turn-off characteristic of an IGBT in the prior art.
Figure 51:
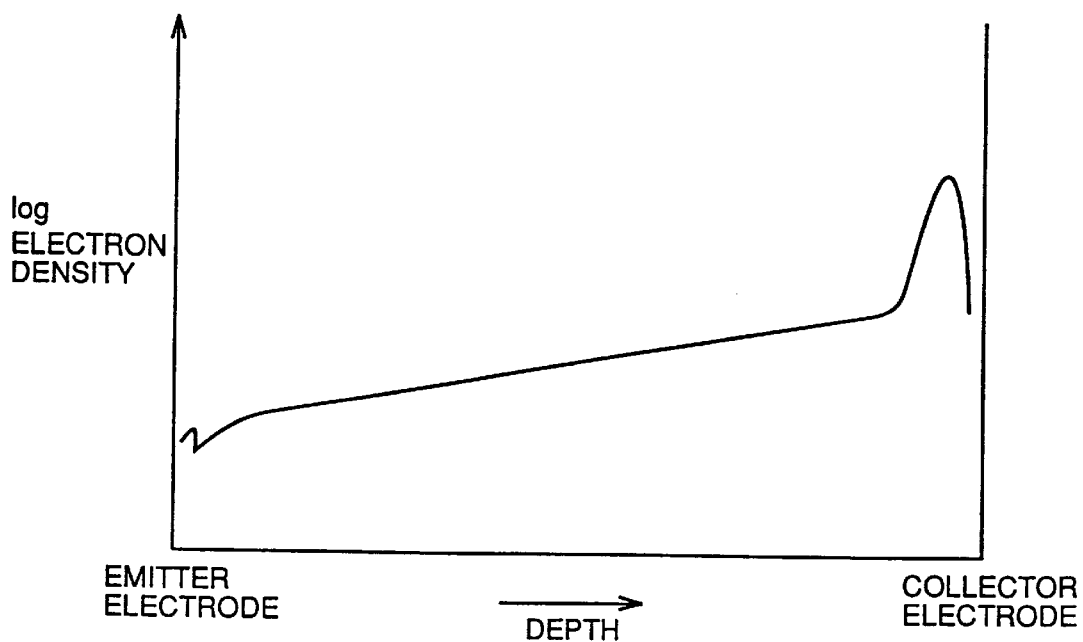
FIG. 51 shows vertical distribution of electron density of the IGBT in the prior art.
Figure 52:
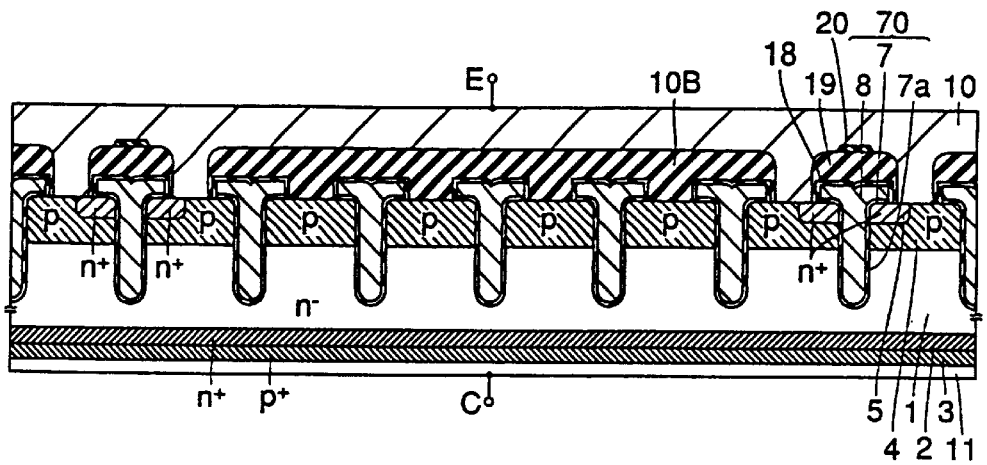
FIG. 52 is a cross section showing an application structure of the high-breakdown-voltage IGBT of the gate trench type in the prior art.
Figure 53:
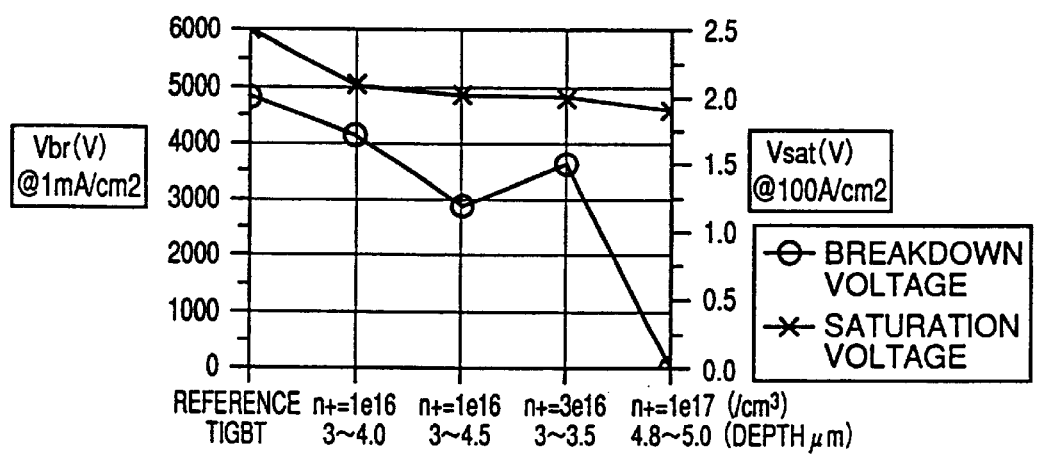
FIG. 53 shows dependency of a breakdown voltage and a saturation voltage on specifications of an n-layer buried under a p-well in the high-breakdown-voltage IGBT of the gate trench type in the prior art.

For example, when one intends to complete a structure in which the trench width and dx are 1 µm, and a ratio of dx to the pitch of gate trenches 70 is 1:20, this structure can be achieved by disposing each gate trench 70 at every ten positions for trenches. By employing this structure, the gate capacity can be reduced approximately to a quarter of that of the standard IGBT of the gate trench type, and the gate capacity can be reduced to one-tenth that of the structure shown in FIG. 50 having the same pitch.

Description will be given on a method of manufacturing the IGBT of the embodiment 3 thus constructed with reference to FIGS. 43 to 46. FIGS. 43 to 46 show sectional structures in different manufacturing steps, respectively.

Figure 43:
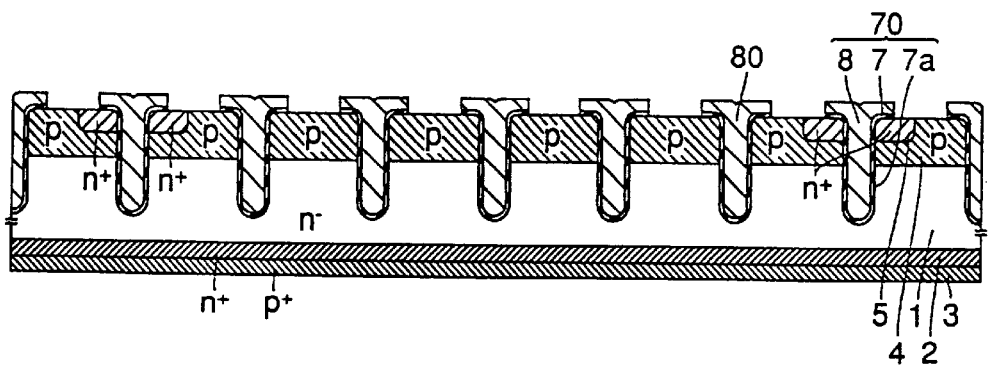
FIGS. 43 to 46 are cross sections showing 1st to 4th steps for manufacturing the high-breakdown-voltage IGBT of the gate trench type of the embodiment 3 of the invention, respectively.
Figure 44:
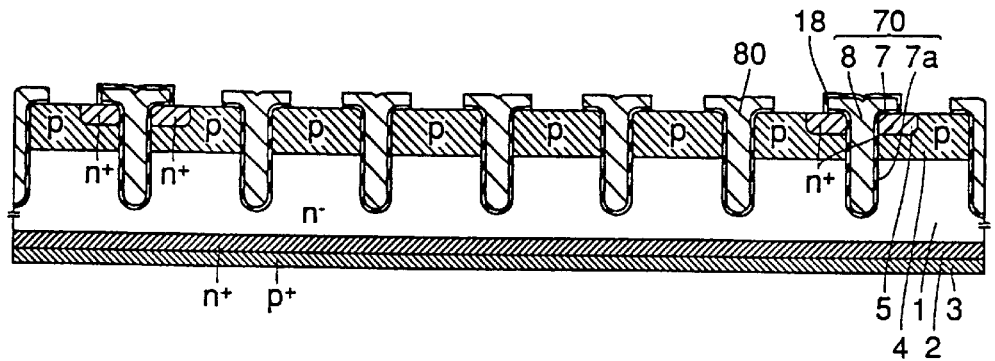

Referring to FIG. 43, steps similar to those of the embodiment 2 shown in FIGS. 32 to 38 are performed to form gate trenches 70 and emitter trenches 80. Referring to FIG. 44, an oxide film 18 is then formed to cover only the surfaces of gate electrodes 8 of gate trenches 70.

Figure 45:
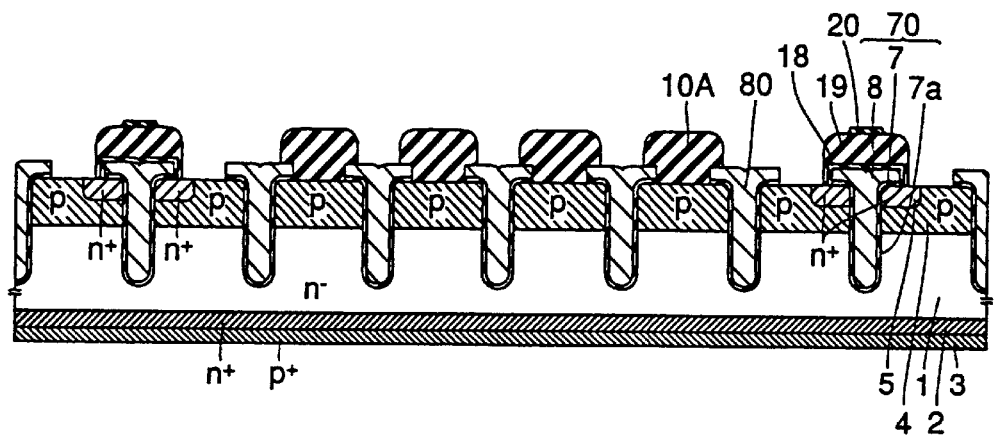

Referring to FIG. 45, silicate glass film 19 and CVD oxide film 20 covering gate trenches 70 are formed, and silicate glass films 10A covering only portions of the p-wells exposed between the emitter trenches are formed.

Figure 46:
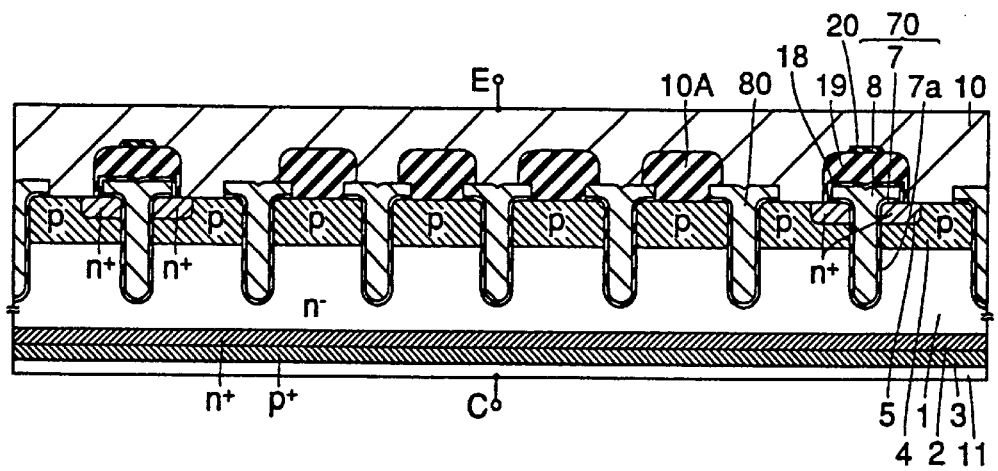

Referring to FIG. 46, emitter electrode 10 is formed entirely over the first main surface of n⁻ silicon substrate 1, and collector electrode 11 is formed over p-collector layer 3 formed at the second main surface of n⁻ silicon substrate 1. Through these steps, the IGBT of the embodiment 3 shown in FIG. 42 is completed.

The IGBT of the embodiment 3 can achieve an effect similar to that by the embodiments 1 and 2. Further, the structure of the embodiment 3 can employ the planar structure of the embodiment 2 shown in FIG. 41, if p-wells 4 and emitter regions 5 cannot be arranged on the same section due to miniaturization of the devices.

Figure 48:
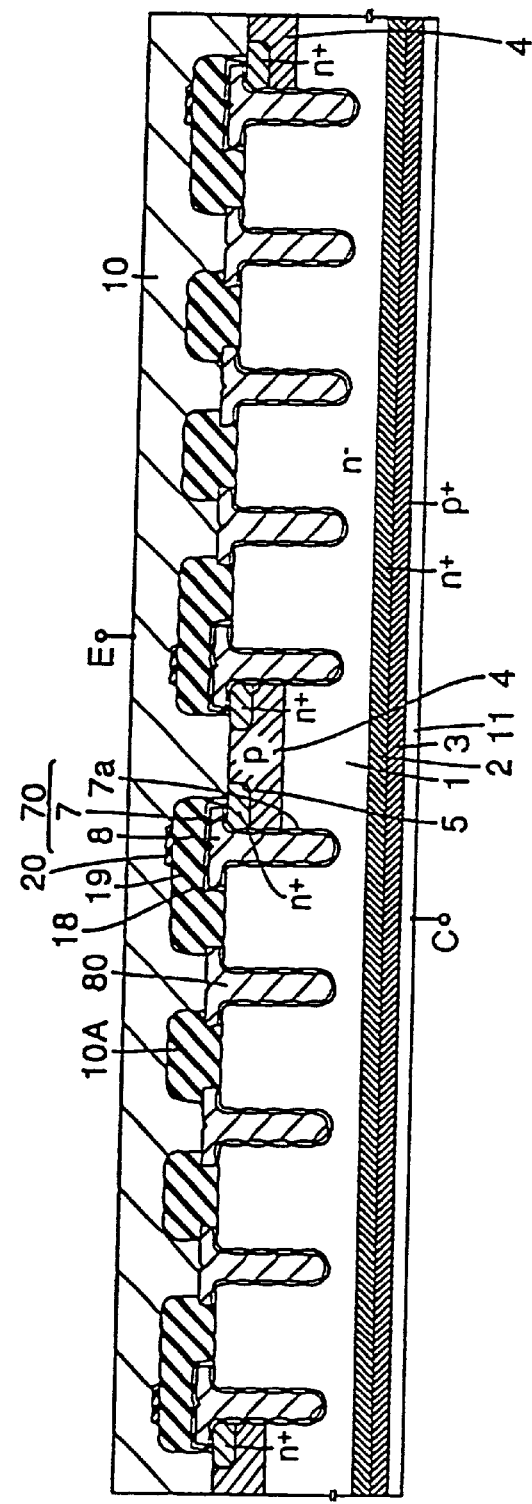
FIG. 48 is another second cross section showing a high-breakdown-voltage IGBT of a gate trench type according to embodiment 3 of the invention.
Figure 49:
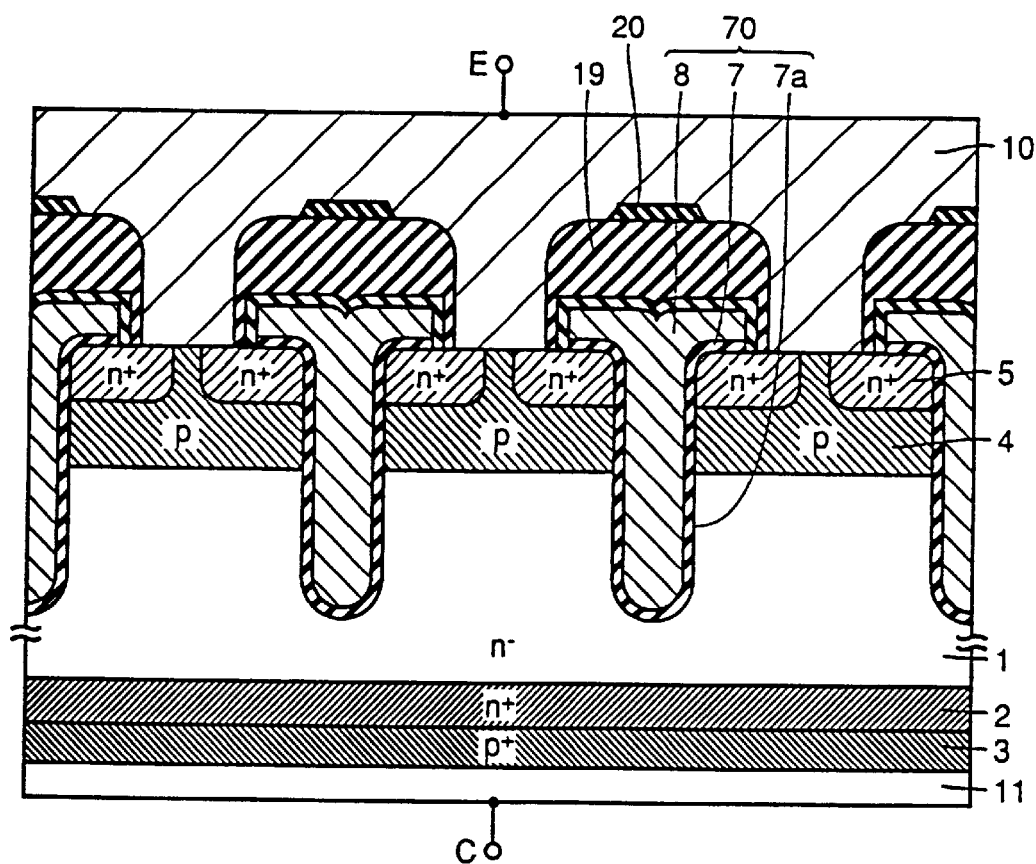
FIG. 49 is a cross section showing a high-breakdown-voltage IGBT of a gate trench type in the prior art.

Here, not only IGBT having the cross sectional structure shown in FIG. 42 but also IGBTs having cross sectional structures shown in FIGS. 47 and 48 can also be adopted. In the IGBT shown in FIG. 47, two gate trenches are provided continuously, with n⁺ emitter region 5 provided at a portion of p well 4 between gate trenches 70 and in contact with gate trench 70. Between the gate trenches 70, one or more emitter trench 80 and p well 4 are provided in repetition. Owing to this structure, exposure rate of p well 4 is reduced, thus improving the carrier supplying capability of the emitter trench 80. In addition, an effect similar to what is obtained in the structure of FIG. 47 can also be obtained even when a structure without p wells 4 at the opposing end portions of emitter trench 80 is adopted, as shown in FIG. 48.

It is clearly understood that all the embodiments described above are by way of illustration and example only and are not to be taken by way of limitation. Although sectional trench structures have been discussed in connection with the embodiments 1 to 3, the invention can be applied not only to the structure including straight gate trench grooves but also to other gate trench grooves, such as ring-shaped grooves or cell-shaped grooves.

Although the n-channel IGBTs using n⁻ silicon substrates have been discussed, the invention can be applied to IGBTs having an opposite polarity, i.e., p-channel IGBTs. The invention can be employed in thyristor-type elements with insulating gates for increasing carriers introduced into substrates.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device with a high breakdown voltage comprising the steps of:
    forming a first semiconductor substrate of a first conductivity type provided at its main surface with an insulating layer;
    arranging a second semiconductor substrate of the first conductivity type over said insulating layer to form a semiconductor substrate having first and second main surfaces and including said insulating layer interposed therebetween;
    forming a first impurity layer of a second conductivity type at said first main surface of said semiconductor substrate;
    forming an impurity region of the first conductivity type at a predetermined region of a surface of said first impurity layer;
    forming a second impurity layer of the second conductivity type at said second main surface;
    forming a groove extending to said insulating layer at said impurity region;
    removing the insulating layer exposed at said groove;
    forming an epitaxial growth layer having the same impurity concentration as said semiconductor substrate at an inner surface of said groove by an epitaxial growth method;
    forming a gate insulating film at a surface of said epitaxial growth layer in said groove;
    filling said groove with an electric conductor to form a gate electrode;
    covering a portion of said gate electrode exposed at said first main surface with an insulating film;
    forming a first main electrode layer covering said first main surface and electrically connected to said first impurity layer and said impurity region; and
    forming a second main electrode layer at said second main surface.

2. The method of manufacturing the semiconductor device with a high breakdown voltage according to claim 1, wherein
    a thickness of said insulating layer is equal to or smaller than a quadruple of a thickness of said gate insulating film.

3. The method of manufacturing the semiconductor device with a high breakdown voltage according to claim 1, further comprising the step of forming a third impurity layer of the first conductivity type having an impurity concentration higher than that of said semiconductor substrate and located at a portion of said second impurity layer near said semiconductor substrate.

4. A method of manufacturing a semiconductor device with a high breakdown voltage comprising the steps of:
    forming a first semiconductor substrate of a first conductivity type provided at its main surface with insulating layers with a predetermined pitch;
    forming a second semiconductor substrate of the first conductivity type provided at its main surface with concavities of the same width and thickness as said insulating layer with the same pitch as said insulating layers;

laminating the main surfaces of said first and second semiconductor substrates together to form a semiconductor substrate having first and second main surfaces and including said insulating layers interposed therebetween with a predetermined pitch;

forming a first impurity layer of a second conductivity type at the first main surface of said semiconductor substrate;

forming an impurity region of the first conductivity type at a predetermined region of the surface of said first impurity layer;

forming a second impurity layer of the second conductivity type at said second main surface;

forming a groove extending to said semiconductor substrate through a region between said insulating layers at said impurity region;

forming a gate insulating film at an inner surface of said groove;

filling said groove with an electric conductor to form a gate electrode;

covering a portion of said gate electrode exposed at said first main surface with an insulating film;

forming a first main electrode layer electrically connected to said first impurity layer and said impurity region and covering said first main surface; and forming a second main electrode layer at said second main surface.

5. The method of manufacturing the semiconductor device with a high breakdown voltage according to claim 4, wherein a thickness of said insulating layer is equal to or smaller than a quadruple of a thickness of said gate insulating film.

6. The method of manufacturing the semiconductor device with a high breakdown voltage according to claim 4, further comprising the step of forming a third impurity layer of the first conductivity type having an impurity concentration higher than that of said semiconductor substrate and located at a portion of said second impurity layer near said semiconductor substrate.

7. The method of manufacturing the semiconductor device with a high breakdown voltage according to claim 4, wherein a bottom of said groove is located at a position deeper than said insulating layer in said step of forming said groove.

8. A method of manufacturing a semiconductor device with a high breakdown voltage comprising the steps of:

preparing a semiconductor substrate of a first conductivity type having first and second main surfaces;

forming a first impurity layer of a second conductivity type at a predetermined region of said first main surface of said semiconductor substrate;

forming an impurity region of the second conductivity type at a predetermined region of a surface of said first impurity layer;

forming a second impurity layer of the second conductivity type at said second main surface;

forming a first groove extending to said semiconductor substrate at said impurity region;

forming a plurality of second grooves at said semiconductor substrate defined by said impurity region;

forming insulating films at inner surfaces of said first and second grooves;

filling said first and second grooves with electric conductors fill to form a buried gate electrode and a buried emitter electrode, respectively;

covering portions of said buried gate electrode and said buried emitter electrode exposed at said first main surface with a second insulating film;

forming a contact hole extending to said buried emitter electrode at said second insulating film formed on said buried emitter electrode;

forming a first main electrode layer covering said first main surface and electrically connected to said first impurity layer, said impurity region and said buried emitter electrode; and forming a second main electrode layer at said second main surface.

9. The method of manufacturing the semiconductor device with a high breakdown voltage according to claim 8, further comprising the step of forming a third impurity layer of the first conductivity type having an impurity concentration higher than that of said semiconductor substrate and located at a portion of said second impurity layer near said semiconductor substrate.

10. The method of manufacturing the semiconductor device with a high breakdown voltage according to claim 8, further comprising the step of forming a first impurity layer of the second conductivity type formed at a predetermined region of said first main surface of said semiconductor substrate extending from said first main surface into said semiconductor substrate in a depthwise direction.

11. The method of manufacturing the semiconductor device with a high breakdown voltage according to claim 8, wherein the step of forming said second groove further comprising the step of forming a plurality of said second grooves at said semiconductor substrate sandwiched by said impurity regions.

* * * * *